(12) United States Patent
Odagawa et al.

(10) Patent No.: US 7,781,230 B2
(45) Date of Patent: Aug. 24, 2010

(54) ELECTRO-RESISTANCE ELEMENT, ELECTRO-RESISTANCE MEMORY USING THE SAME AND METHOD OF MANUFACTURING THE SAME

(75) Inventors: Akihiro Odagawa, Osaka (JP); Yoshihisa Nagano, Osaka (JP)

(73) Assignee: Panasonic Corporation, Osaka (JP)

( * ) Notice: Subject to any disclaimer, the term of this patent is extended or adjusted under 35 U.S.C. 154(b) by 579 days.

(21) Appl. No.: 11/683,580

(22) Filed: Mar. 8, 2007

(65) Prior Publication Data

US 2007/0240995 A1    Oct. 18, 2007

(30) Foreign Application Priority Data

Apr. 13, 2006    (JP)    ............... 2006-110347

(51) Int. Cl.
*B23B 9/00*    (2006.01)

(52) U.S. Cl. ............... 438/3; 365/145; 365/158; 257/E21.663; 257/E27.104

(58) Field of Classification Search .......... 257/E21.663, 257/E27.104; 438/3; 365/145, 158
See application file for complete search history.

(56) References Cited

U.S. PATENT DOCUMENTS 6,204,139 B1    3/2001    Liu et al.

2002/0036315 A1*    3/2002    Adachi et al. ............... 257/310
2004/0245557 A1    12/2004    Seo et al.

FOREIGN PATENT DOCUMENTS

| JP | 2002-280542 | 9/2002 |
|---|---|---|
| JP | 2002-537627 | 11/2002 |
| JP | 2004-363604 | 12/2004 |
| WO | WO 00/49659 | 8/2000 |

* cited by examiner

*Primary Examiner*—David Vu
*Assistant Examiner*—Suberr Chi
(74) *Attorney, Agent, or Firm*—Hamre, Schumann, Mueller & Larson, P.C.

(57) ABSTRACT

An electro-resistance element that has a different configuration from conventional elements and is excellent in both affinity with semiconductor manufacturing processes and resistance change characteristics is provided. An electro-resistance element has two or more states in which electric resistance values between a pair of electrodes and is switchable from one of the two or more states into another by applying a predetermined voltage or current between the electrodes. The electro-resistance element includes a substrate and a multilayer structure disposed on the substrate, the multilayer structure includes an upper electrode, a lower electrode and an electro-resistance layer disposed between the electrodes, wherein the electro-resistance layer includes $Fe_2O_3$, and $Fe_3O_4$ contained in an amount of 0% to 20% of $Fe_2O_3$ in percent by weight, the lower electrode is made of an iron oxide having a different composition from the electro-resistance layer and containing $Fe_3O_4$, and the electro-resistance layer and the lower electrode make contact with each other.

16 Claims, 30 Drawing Sheets

ELECTRO-RESISTANCE ELEMENT, ELECTRO-RESISTANCE MEMORY USING THE SAME AND METHOD OF MANUFACTURING THE SAME

BACKGROUND OF THE INVENTION

1. Field of the Invention

The present invention relates to an electro-resistance element, the resistance value of which changes by applying a voltage or current, to an electro-resistance memory using the same and to a method of manufacturing the same.

2. Related Background Art

Memory elements are used in a wide variety of fields as essential electronic components that are important to support today's information-driven society. In recent years, as portable information terminals have become increasingly popular, demands for miniaturization of memory elements have been increasing, and non-volatile memory elements are not exceptions. As the scale of device miniaturization is approaching the nanometer range, however, a decrease in charge capacity C per information unit, i.e. bit, has become a problem with conventional charge storage type memory elements, typically DRAMs: Dynamic Random Access Memories. Although various improvements have been attempted to obviate this problem, there is a concern over the future technological limit.

As a memory element that is less prone to the adverse effects of miniaturization, a non-volatile memory element, i.e. an electro-resistance memory element, that records information by changes in electric resistance value R, not by changes in charge capacity C, has attracted attention. As this sort of electro-resistance memory element, an electro-resistance element that changes its electric resistance value R by applying a predetermined voltage or current is under development.

A typical electro-resistance element has a structure in which its electro-resistance layer is sandwiched by a pair of electrodes, and its electric resistance value R is changed by applying a predetermined voltage or current between the pair of electrodes. Such a change in the electric resistance value R is based on the state change of the electro-resistance layer by applying the predetermined voltage or current, and is generally known as a CER effect: a Colossal Electro-Resistance effect. A CER effect is different in principle from a so-called MR effect: a Magneto-Resistance effect, which is also a phenomenon in which an electric resistance value R of an element is changed.

An MR effect is a phenomenon in which an electric resistance value between a pair of magnetic materials sandwiching a non-magnetic material is changed when a direction of magnetization of one of the magnetic materials changes from parallel to antiparallel, or from antiparallel to parallel, to that of the other magnetic material. Currently, an MRAM: a Magneto-resistance Random Access Memory, using an element showing an MR effect, i.e. an MR element, is under development. However, as a component called demagnetizing field in the magnetic material increases with miniaturization of the material, a magnetic field required to reverse a direction of magnetization becomes larger; thus, it is difficult to miniaturize further than a certain extent by using an MR element. As a CER effect does not have such a "size restriction" and it gains generally larger electric resistance change compared to an MR effect, an electro-resistance element is highly expected as the next generation non-volatile memory implementing even further miniaturization, such as a ReRAM: an electro-Resistance Random Access Memory.

As this sort of electro-resistance element, U.S. Pat. No. 6,204,139 and JP 2002-537627A disclose elements including perovskite oxides in electro-resistance layers. The former publication mentions the oxide with $Pr_{0.7}Ca_{0.3}MnO_3$ (PCMO), and the latter uses Cr-doped $BaSrTiO_3$ (BSTCO). JP 2004-363604A discloses an element including metallic oxides, such as NiO, in an electro-resistance layer. JP 2002-537627A also indicates that $Fe_3O_4$ (magnetite), which is an iron oxide, may be included as an electro-resistance layer (see, for example, paragraph [0025]), and JP 2002-280542A describes similarly (see, for example, paragraph [0007]).

In order to construct a memory cell array using electro-resistance elements, the element needs to be combined with a semiconductor element for selecting the element on recording and reading information, such as a transistor or a diode. Crystallization of perovskite oxides, such as PCMO, however, requires a high temperature between the range of 650° C. and 850° C., which leads to an issue of affinity with semiconductor manufacturing processes. In particular, in order to achieve element miniaturization, it is desired that the manufacturing process temperature for the electro-resistance element be set lower than the range above, for example 400° C. or lower.

Although it is possible to form an element in a lower temperature range when $Fe_3O_4$ as an electro-resistance layer is used compared to using perovskite oxides, the resistivity of $Fe_3O_4$ is inherently low, and it is difficult to enlarge an element resistance, i.e. impedance. When element impedance becomes small, the gained resistance change ratio becomes smaller or it becomes difficult to apply a pulse voltage described below on the element.

It is an object of the present invention to provide an electro-resistance element that has a different configuration from those of the conventional elements and is excellent in its affinity with semiconductor manufacturing processes as well as its resistance change characteristics.

Another object of the present invention is to provide a method of manufacturing the element.

A further object of the present invention is to provide an electro-resistance memory.

SUMMARY OF THE INVENTION

The present invention provides a first electro-resistance element including a substrate and a multilayer structure disposed on the substrate, the multilayer structure including an upper electrode, a lower electrode, and an electro-resistance layer disposed between the upper and the lower electrodes. The first electro-resistance element has two or more states in which electric resistance values between the upper and the lower electrodes are different, and is switchable from one of the two or more states into another by applying a predetermined voltage or current between the upper and the lower electrodes. The electro-resistance layer includes $Fe_2O_3$, and $Fe_3O_4$ contained in an amount of 0% to 20% of $Fe_2O_3$ in percent by weight. The multilayer structure further includes an iron oxide film having a different composition from the electro-resistance layer and containing $Fe_3O_4$. The iron oxide film is disposed to make contact with a principal surface of the electro-resistance layer that faces the lower electrode.

Here, "the electro-resistance layer includes $Fe_2O_3$ and $Fe_3O_4$ contained in an amount of 0% to 20% of $Fe_2O_3$ in percent by weight" means "the electro-resistance layer does not include $Fe_3O_4$" or "$Fe_3O_4$ contained in the electro-resistance layer is in an amount of 0% to 20% in percent by weight of $Fe_2O_3$ content in the layer when the electro-resistance layer includes $Fe_3O_4$".

The present invention further provides a second electro-resistance element, which is defined from a different perspective from above, including a substrate and a multilayer structure disposed on the substrate, the multilayer structure including an upper electrode, a lower electrode, and an electro-resistance layer disposed between the upper and the lower electrodes. The second electro-resistance element has two or more states in which electric resistance values between the upper and the lower electrodes are different, and is switchable from one of the two or more states into another by applying a predetermined voltage or current between the upper and the lower electrodes. The electro-resistance layer includes $Fe_2O_3$, and $Fe_3O_4$ contained in an amount of 0% to 20% of $Fe_2O_3$ in percent by weight. The lower electrode is made of an iron oxide having a different composition from the electro-resistance layer and containing $Fe_3O_4$. The electro-resistance layer and the lower electrode make contact with each other.

The present invention still further provides an electro-resistance memory including the electro-resistance elements according to the present invention as a memory element.

The present invention still further provides a first method of manufacturing the electro-resistance element, which is a method of manufacturing the first electro-resistance element. The first method includes forming a lower electrode on a substrate; forming an iron oxide film including $Fe_3O_4$ on the lower electrode; forming an electro-resistance layer having a different composition from the iron oxide film, and including $Fe_2O_3$ and $Fe_3O_4$ contained in an amount of 0% to 20% of $Fe_2O_3$ in percent by weight, on the iron oxide film to make contact with each other; and forming an upper electrode sandwiching the electro-resistance layer with the lower electrode.

The present invention still further provides a second method of manufacturing the electro-resistance element, which is a method of manufacturing the second electro-resistance element. The second method includes forming a lower electrode made of an iron oxide containing $Fe_3O_4$ on a substrate; forming an electro-resistance layer having a different composition from the iron oxide, and including $Fe_2O_3$ and $Fe_3O_4$ contained in an amount of 0% to 20% of $Fe_2O_3$ in percent by weight, on the lower electrode to make contact with each other; and forming an upper electrode sandwiching the electro-resistance layer with the lower electrode.

In the first electro-resistance element, the electro-resistance layer includes $Fe_2O_3$ and $Fe_3O_4$ contained in an amount of 0% to 20% of $Fe_2O_3$ in percent by weight, and the iron oxide film, having a different composition from the electro-resistance layer and containing $Fe_3O_4$, is disposed to make contact with a principal surface of the electro-resistance layer that faces the lower electrode. In the second electro-resistance element, its electro-resistance layer is same as that of the first element, and the lower electrode, made of an iron oxide having a different composition from the electro-resistance layer and containing $Fe_3O_4$, is disposed to make contact with the electro-resistance layer. These electro-resistance elements according to the present invention are excellent in their affinity with semiconductor manufacturing processes, such as enabling formation by a manufacturing process at a temperature of 400° C. or lower, distinguished from conventional electro-resistance elements in which perovskite compounds are used as electro-resistance layers.

The electro-resistance elements of the present invention are excellent in their resistance change characteristics as well. As mentioned above, it is difficult to enlarge the impedance of elements having an electro-resistance layer made of $Fe_3O_4$ due to its low resistivity. Resistivity of $Fe_2O_3$, which is a form of iron oxide like $Fe_3O_4$, is larger than that of $Fe_3O_4$; allowing the electro-resistance layer having $Fe_2O_3$ to have increased impedance of the element and improvement of the resistance change characteristics. As described in the following examples, however, it is not possible to obtain an element with excellent resistance change characteristics by simply replacing $Fe_3O_4$ with $Fe_2O_3$ in a composition of an electro-resistance layer.

The inventors of the present invention have found that excellent resistance change characteristics are obtained by making an electro-resistance layer including $Fe_2O_3$ and disposing an iron oxide film, having a different composition from the electro-resistance layer and containing $Fe_3O_4$, to make contact with a principal surface of the electro-resistance layer that faces a lower electrode (the first electro-resistance element). In addition, they have found that such characteristics are obtained also by making an electro-resistance layer including $Fe_2O_3$ and disposing a lower electrode, having a different composition from the electro-resistance layer and being made of an iron oxide containing $Fe_3O_4$, to make contact with electro-resistance layer (the second electro-resistance element).

One possible explanation for the electro-resistance elements of the present invention showing excellent resistance change characteristics is that an interface state improving the resistance change characteristics of the element is formed between the electro-resistance layer and the iron oxide film in the case of the first electro-resistance element and between the electro-resistance element and the lower electrode in the case of the second electro-resistance element.

DETAILED DESCRIPTION OF THE INVENTION

Figure 1:
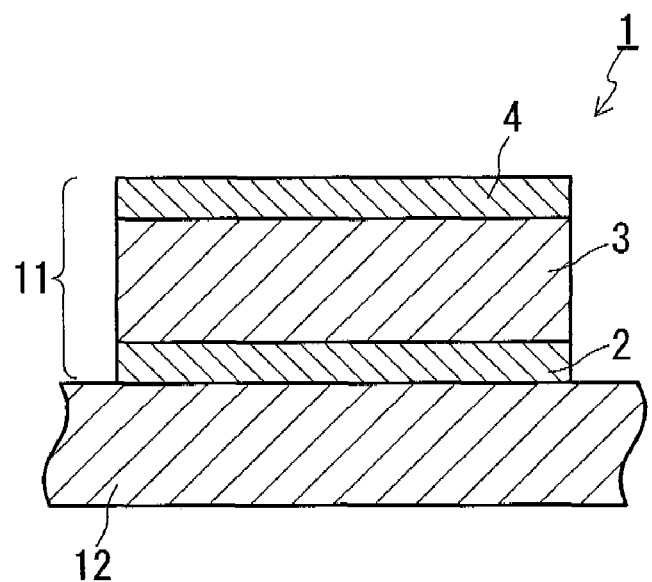
FIG. 1 is a cross-sectional view schematically illustrating an example of the electro-resistance element according to the present invention.

Hereinbelow, preferred embodiments of the present invention are described with reference to the drawings. In the following description, the same components are denoted by the same reference numerals, and further elaboration thereof may be omitted.

An electro-resistance element 1 shown in FIG. 1 is an example of the second electro-resistance element. The element 1 includes a substrate 12, a pair of electrodes, which are a lower electrode 2 and an upper electrode 4, and an electro-resistance layer 3 sandwiched by the lower electrode 2 and the upper electrode 4. The lower electrode 2, the electro-resistance layer 3 and the upper electrode 4 are disposed to make contact with each other as a multilayer structure (stacked structure) 11 on the substrate 12 in the above order.

The layer 3 includes $Fe_2O_3$, and $Fe_3O_4$ contained in an amount of 0% to 20% of $Fe_2O_3$ in percent by weight. The lower electrode 2 is made of an iron oxide having a different composition from the layer 3 and containing $Fe_3O_4$.

The element 1 has two or more states in which electric resistance values between the lower electrode 2 and the upper electrode 4 are different. The element 1 may be switched from one of the two or more states into another by applying a predetermined voltage or current to the element 1, more concretely between the lower electrode 2 and the upper electrode 4. When the electrode 1 has two states in which electric resistance values are different, where a state A is defined as a state of relatively high resistance and a state B as that of relatively low resistance, the element 1 is switched from the state A into the state B, or from the state B into the state A, by applying a predetermined voltage or current. The predetermined voltage or current also may be described as being applied to the layer 3.

The element 1 described above shows excellent resistance change characteristics, and it is possible to gain a high resistance change ratio, for instance. The resistance change ratio is a numerical value that serves as an index of the resistance change characteristics of an element, and is a value obtained by the formula $(R_{MAX}-R_{MIN})/R_{MIN}$, wherein $R_{MAX}$ denotes the maximum electric resistance value and $R_{MIN}$ denotes the minimum electric resistance value that the element shows.

The element 1 can be formed by manufacturing processes at a lower temperature compared to conventional electro-resistance elements in which perovskite compounds are used as electro-resistance layers, for example at a temperature of 400° C. or lower, which makes it excellent in its affinity with semiconductor manufacturing processes. That is, the element 1 having the above configuration facilitates application to various devices combined with semiconductive elements, such as electro-resistance memories, and it brings an advantage in achieving miniaturization of elements and in improving integration and characteristics of devices associated with the miniaturization of elements.

The composition of the layer 3 is not particularly limited as long as it includes $Fe_2O_3$, and $Fe_3O_4$ contained in an amount of 0% to 20% of $Fe_2O_3$ in percent by weight. The composition of the layer 3 may be evaluated by analytical methods, such as Auger electron spectroscopy, crystallography by X-ray diffraction, infrared spectroscopy and Raman scattering spectroscopy. The composition of the lower electrode 2 and an iron oxide film 5 described below may be evaluated in the same manner.

The layer 3 is preferably made of an iron oxide, and in this case, the layer 3 may be made of either $Fe_2O_3$ and $Fe_3O_4$, or $Fe_2O_3$. In particular, when the layer 3 is made of $Fe_2O_3$, the resistance change characteristics of the element can be improved even more; a higher resistance change ratio can be obtained, for instance.

When the layer 3 is made of $Fe_2O_3$ and $Fe_3O_4$, the layer 3 also may be described as being made of $Fe_2O_3$ contained in the range of 83.3% to less than 100% in percent by weight and of $Fe_3O_4$ contained in the range of more than 0% to 16.7% in percent by weight. Considering the content range, the layer 3 made of $Fe_2O_3$ and $Fe_3O_4$ may be described as an iron oxide layer including $Fe_2O_3$ as a main constituent and $Fe_3O_4$ as a partial constituent, as well.

Because the resistance change characteristics of the element can be more improved, the $Fe_3O_4$ content in the layer 3 is preferably 15% or lower of the $Fe_2O_3$ content in the layer 3 in percentage by weight, and is more preferably 10% or lower.

The composition of the lower electrode 2 is not particularly limited as long as it is different from the composition of the layer 3 and includes $Fe_3O_4$. It is preferably made of $Fe_3O_4$ because the resistance change characteristics of the element can be improved. When the lower electrode 2 is made of $Fe_3O_4$, its resistivity is preferably $5\times10^{-2}$ Ω·cm or lower.

The lower electrode 2 preferably has a configuration in which the layer 3 can grow by crystallization on the surface of the lower electrode 2. In this case, forming the layer 3 having a stable crystal structure is better facilitated; it is possible to construct the element 1 that shows more excellent resistance change characteristics because of the stability in the crystal structure of the layer 3.

Although the combination of the layer 3 and the lower electrode 2 is not particularly limited, the layer 3 is preferably made of $Fe_2O_3$ and the lower electrode 2 is preferably made of $Fe_3O_4$, in particular. Adopting this combination enables further improvement of the resistance change characteristics of the element, and it even improves the endurance characteristics of an electro-resistance memory constructed with the element.

One possible reason why the combination of the layer 3 made of $Fe_2O_3$ and the lower electrode 2 made of $Fe_3O_4$ is particularly preferred is the effects on forming a favorable interface state with grating constants of $Fe_2O_3$ and $Fe_3O_4$ that are almost similar but slightly different as the former is 0.835 nm and the latter is 0.840 nm. In addition, as both $Fe_2O_3$ and $Fe_3O_4$ are iron oxides, interdiffusion on their interface is not considered likely to occur; thus it is supposed that the endurance characteristics are improved upon forming the memory.

Figure 2:
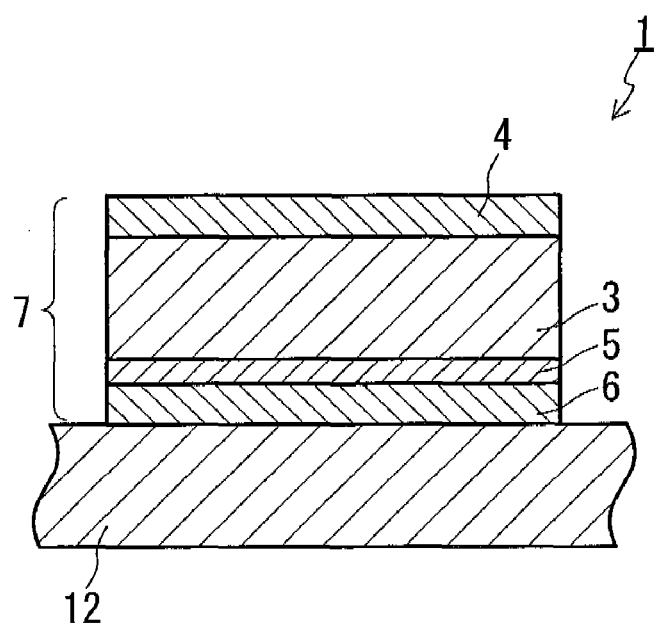
FIG. 2 is a cross-sectional view schematically illustrating another example of the electro-resistance element according to the present invention.

FIG. 2 shows another example of an electro-resistance element of the present invention. The electro-resistance element 1 shown in FIG. 2 is an example of the first electro-resistance element. The element 1 includes a substrate 12, a pair of electrodes, which are a lower electrode 6 and the upper electrode 4, the electro-resistance layer 3 sandwiched by the lower electrode 6 and the upper electrode 4 and the iron oxide film 5 disposed to make contact with a principal surface of the layer 3 that faces the lower electrode 6. The lower electrode 6, the film 5, the layer 3 and the upper electrode 4 are disposed to make contact with each other as a multilayer structure (stacked structure) 7 on the substrate 12 in the above order.

The layer 3 includes $Fe_2O_3$, and $Fe_3O_4$ contained in an amount of 0% to 20% of $Fe_2O_3$ in percent by weight. The film 5 contains $Fe_3O_4$ and has a different composition from the layer 3.

The composition of the film 5 may have the same composition as the lower electrode 2 described above; it is preferably made of $Fe_3O_4$ because the resistance change characteristics of the element can be more improved.

The film 5 preferably has a configuration in which the layer 3 can grow by crystallization on the surface of the film 5. In this case, forming the layer 3 having a stable crystal structure is better facilitated; it is possible to construct the element 1 that shows more excellent resistance change characteristics because of the stability in the crystal structure of the layer 3.

Although the combination of the layer 3 and the film 5 is not particularly limited, the layer 3 is preferably made of $Fe_2O_3$ and the film 5 is preferably made of $Fe_3O_4$, in particular. Adopting this combination enables further improvement of the resistance change characteristics of the element, and furthermore it even improves the endurance characteristics of an electro-resistance memory constructed with the element.

The configuration of the film 5 in the first element is not particularly limited as long as the film 5 is disposed to make contact with a principal surface of the layer 3 that faces the lower electrode 6. For instance, the surface of the lower electrode 6 that faces the layer 3 may be made of the film 5, and the lower electrode 6 makes contact with the layer 3 in this case.

It is basically sufficient for the lower electrode 6 to have electrical conductivity, and may be made of, for instance, the materials same as the upper electrode 4 described below.

The configuration of the first element is not particularly limited as far as the structure 7 including the lower electrode 6, the film 5, the layer 3 and the upper electrode 4 is formed on the substrate 12, as the layer 3 is sandwiched by the lower electrode 6 and the upper electrode 4, and as the film 5 is disposed to make contact with a principal surface of the layer 3 that faces the lower electrode 6.

The configuration of the second element is not particularly limited as long as the structure 11 including the lower electrode 2, the layer 3 and the upper electrode 4 is formed on the substrate 12, the layer 3 is sandwiched by the lower electrode 2 and the upper electrode 4, and the lower electrode 2 and the layer 3 make contact with each other.

Figure 3:
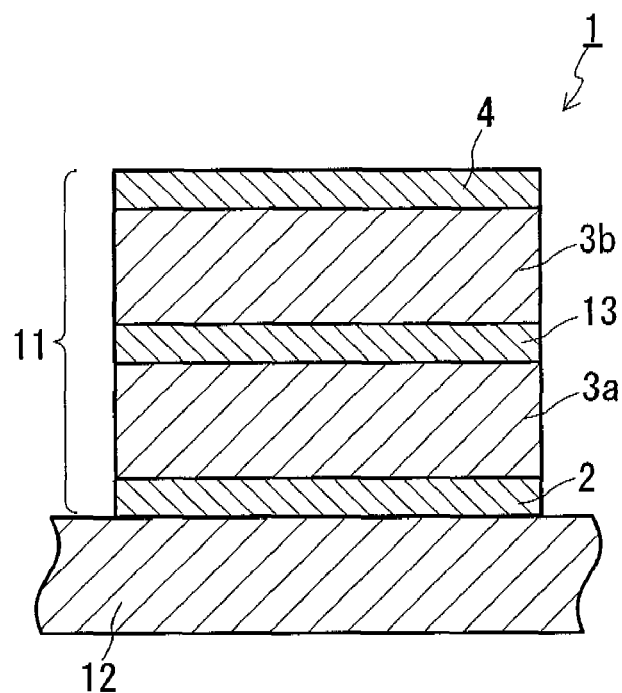
FIG. 3 is a cross-sectional view schematically illustrating still another example of the electro-resistance element according to the present invention.

For example, a pair of electro-resistance layers 3a and 3b sandwiching an intermediate electrode 13 may be disposed between the upper electrode 4 and the lower electrode 2 as shown in FIG. 3. In this case, by applying a predetermined voltage or current to at least one of the electrode pairs selected from the pairs between the lower electrode 2 and the intermediate electrode 13, the upper electrode 4 and the intermediate electrode 13, and the lower electrode 2 and the upper electrode 4, the element 1 is switchable among at least three states, each having a different electric resistance value. In other words, the element 1 achieving multi-level states is realized. Moreover, even further multi-level states can be achieved by stacking the similar multilayer structure(s).

The element 1 shown in FIG. 3 allows the intermediate electrode 13 to have a composition the same as that of the lower electrode 2, and it is possible to construct the element 1 that shows more excellent resistance change characteristics in this case.

In the first element, similarly, the electro-resistance layers 3a and 3b sandwiching the intermediate electrode 13 may be disposed between the upper electrode 4 and the lower electrode 6.

Hereinafter, the matters found in common in both the first and second elements are described. The second element is used for the illustration below for the convenience, and the context should be understood in the same manner as the first element, for instance by replacing "the lower electrode 2" as "the lower electrode 6".

It is basically sufficient for the upper electrode 4 to have electrical conductivity, and may be made of, for instance, Au (gold), Pt (platinum), Ru (ruthenium), Ir (iridium), Ti (titanium), Al (aluminum), Cu (copper), Ta (tantalum), Fe (iron), Rh (rhodium), iridium-tantalum alloy (Ir—Ta) or indium-tin oxide (ITO), or alloys, oxides, nitrides, fluorides, carbides, borides of these. From a perspective of further improving affinity with semiconductor manufacturing processes, the upper electrode 4 preferably is made of materials resistant to oxidizing or capable of maintaining electrical conductivity after oxidization, such as Ir, Ru, Rh, Pt and Au. From the same perspective, the upper electrode 4 is preferably made of oxides, such as Ir—O (iridium oxide), Ru—O (ruthenium oxide), Rh—O (rhodium oxide), or of nitrides, such as Ti—N (titanium nitride), Fe—N (iron nitride), Ti—Al—N (titanium aluminum nitride). The upper electrode 4 may be made of a stacked structure having two or more different materials selected from the materials above. In the case of the upper electrode 4 made of Ti—Al—N, the proportion of Al to the sum of Al and Ti is preferably 50% or less in the atomic composition ratio or in order to maintain its electrical conductivity.

The substrate 12 may be, for example, a silicon (Si) substrate and a surface of the substrate 12 that makes contact with the lower electrode 2 may be oxidized, i.e. an oxide film may be formed on the surface, in this case. In the case of the substrate 12 being a Si substrate, combining the element of the present invention and semiconductive elements is facilitated. In the present specification, processed substrates with transistors or contact plugs (may be referred to simply as "plugs") formed thereon are also mentioned as "substrates".

The predetermined voltage or current may be applied to the element 1 via the lower electrode 2 and the upper electrode 4.

By applying the predetermined voltage or current, the state of the element 1 changes, for example, from the state A into the state B. The state after the change, for example, the state B, is retained until a predetermined voltage or current is applied to the element 1 again, and that state is changed again, for example, from the state B to the state A by applying the voltage or current.

The predetermined voltages or currents to be applied to the element 1 in the states A and B are not necessarily the same, and their properties, such as magnitude, polarity and flowing direction, may vary depending on the state of the element 1. That is, "a predetermined voltage or current" in the present specification may be such a "voltage or current" that the element 1 in a certain state can be changed into another state that is different from the former state. In addition, "a predetermined voltage or current" in the present specification also may be defined as a driving voltage or current.

Thus, the element 1 is able to hold its electric resistance value until a predetermined voltage or current is applied to the element 1; a non-volatile electro-resistance memory, which is a memory element or a memory array in which two or more memory elements are aligned, can be constructed by combining the element 1 and a mechanism for detecting the states of the element 1, i.e. a mechanism for detecting the electric resistance value of the element 1, and assigning a bit to each of the states, for example, the state A is assigned to "0" and the state B to "1". In addition, it is possible to repeat such a state switching at least twice in the element 1, so that a non-volatile random access memory can be constructed. Further, it is also possible to apply the element 1 to a switching element by assigning ON or OFF to each of the above states.

It is preferable that the voltage or current to be applied to the element 1 is in a pulse form (a pulsed voltage or a pulsed current). On constructing a device, such as a memory, using the element 1, it becomes possible to reduce power consumption and improve switching efficiency in the device. The pulse shape is not particularly limited and may be at least one selected from, for example, a sine waveform, a rectangular waveform and a triangular waveform. The pulse width may be generally in the range of several nanoseconds to several milliseconds.

In order to further facilitate driving the devices, the pulse shape is preferably in a triangular waveform. In order to make the response of the element 1 faster, the pulse shape is preferably in a rectangular waveform, which enables a response in the range of several nanoseconds to several microseconds. In order to achieve facilitated driving, reduced power consumption and faster response speed all together, the pulse shape is preferably in a sine waveform or in a trapezoidal waveform, formed by replacing rising and falling edges of the rectangular waveform with adequately sloped shapes. The pulses of the sine and trapezoidal waveforms are suitable for the response speed of the element 1 set in the range of several ten nanoseconds to several hundred microseconds, while the triangular waveform pulse is suitable for the response speed of the element 1 set in the range of several ten microseconds to several milliseconds.

It is preferred to apply a voltage to the element 1, which further facilitates miniaturization of the element 1 and size reduction of the devices using the element 1. In the case of the element 1 having the two states of the states A and B, a potential difference-applying device for creating a potential difference between the lower electrode 2 and the upper electrode 4 may be connected to the element 1. Here, for example, the state of the element 1 may be changed from the state A into the state B by applying a bias voltage such that the potential of the upper electrode 4 becomes positive compared to that of the lower electrode 2, i.e. positive bias voltage, to the element 1, while the state of the element 1 may be changed from the state B into the state A by applying a bias voltage such that the potential of the upper electrode 4 becomes negative compared to that of the lower electrode 2, i.e. negative bias voltage, to the element 1. In other words, by applying a voltage with its polarity reversed from that on changing from the state A into the state B, the state of the element 1 may be changed from the state B into the state A. A pulse generator may be used, for example, as such a potential difference-applying device.

It becomes possible to construct an electro-resistance memory by combining the electro-resistance element of the present invention with a semiconductor element, for example a diode or a transistor, such as a MOS field-effect transistor (MOS-FET).

Figure 4:
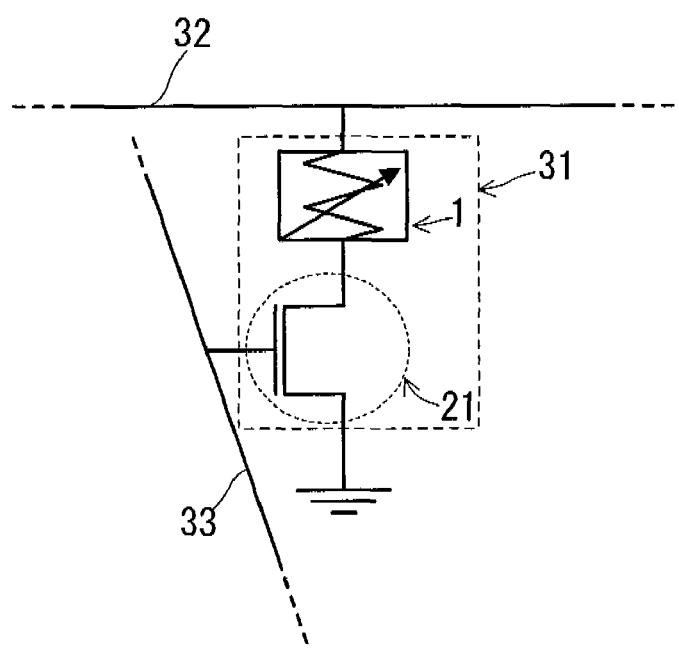
FIG. 4 is a schematic view illustrating an example of the electro-resistance memory (element) provided with the electro-resistance element according to the present invention.

FIG. 4 shows an example of an electro-resistance memory (element) combining the electro-resistance element of the present invention and a MOS-FET.

An electro-resistance memory element 31 shown in FIG. 4 has the electro-resistance element 1 and a transistor 21, and the element 1 is connected electrically to the transistor 21 and a bit line 32. A gate electrode of the transistor 21 is connected electrically to a word line 33, and the other electrode of the transistor 21 is grounded. Such a memory element 31 enables detection of the states in the element 1, i.e. detection of the electric resistance value of the element 1, and application of a predetermined voltage or current to the element 1, using the transistor 21 as a switching element. For example, in the case where the element 1 shows two states in which electric resistance values are different, the memory element 31 shown in FIG. 4 may be used as a 1-bit electro-resistance memory element.

It is sufficient that the transistor 21 has a common configuration, such as a MOS-FET.

Figure 5:
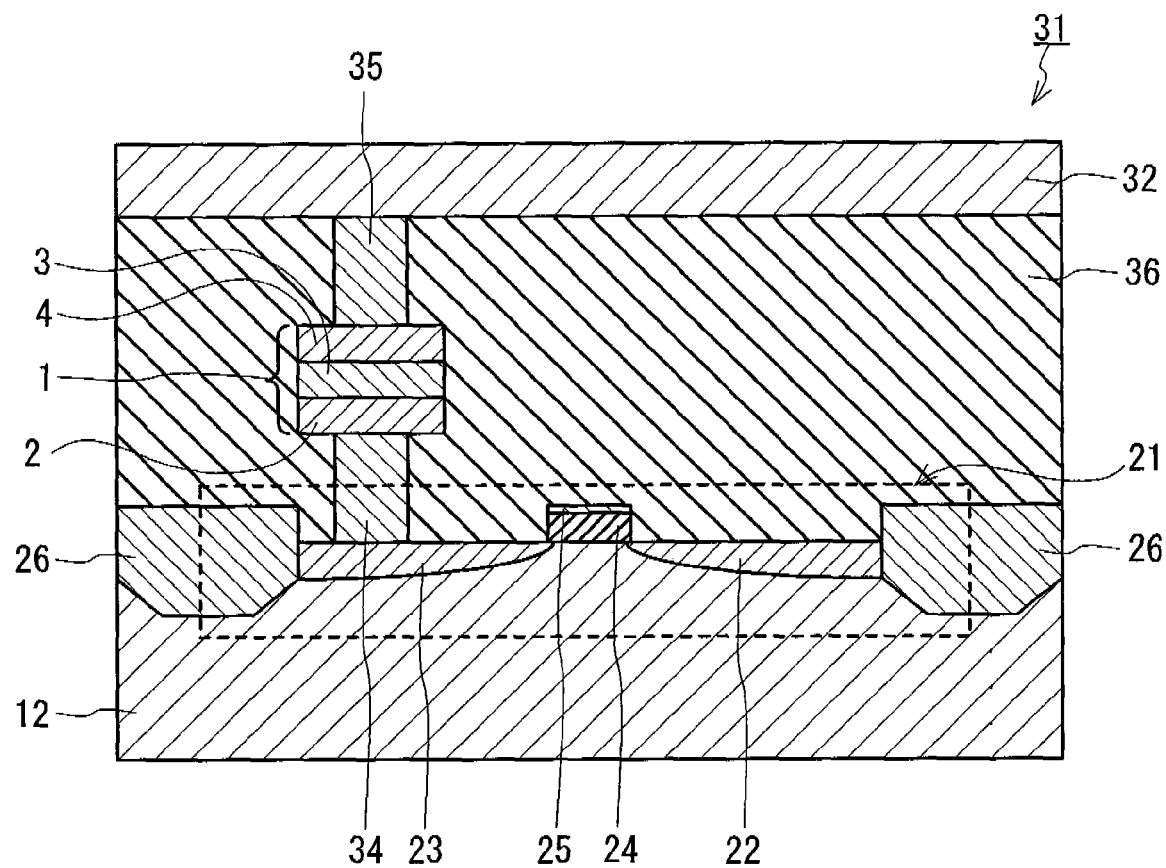
FIG. 5 is a cross-sectional view schematically illustrating an example of the electro-resistance memory (element) provided with the electro-resistance element of the present invention.

FIG. 5 shows an example of a specific configuration of the memory element 31 having the electro-resistance element 1 and the transistor 21. In the memory element 31 shown in FIG. 5, the element 1 is formed on the substrate 12 on which the transistor 21 is formed, and the transistor 21 and the element 1 are integrated. More specifically, a source 22 and a drain 23 are formed on the substrate 12, and the drain 23 and the lower electrode 2 of the element 1 are electrically connected via a plug 34. The source 22 may be electrically connected, such as by grounding, though the electrical connection is not shown in the figure. A gate insulating film 24 and a gate electrode 25 are formed between the source 22 and the drain 23 on the substrate 12, and the electro-resistance layer 3 and the upper electrode 4 are stacked on the lower electrode 2 of the element 1 in this order. The gate electrode 25 is connected electrically to a word line (not shown), and the upper electrode 4 is connected electrically to the bit line 32 via a plug 35, as well. An interlayer insulating layer 36 is disposed on the substrate 12 overlaying all over the surface of the substrate 12, the transistor 21 and the element 1. The parts indicated with a reference numeral 26 on the substrate 12 are defined as an element isolating section.

The interlayer insulating layer 36 may be made of an insulating material, such as $SiO_2$ or $Al_2O_3$, or may have a stacked structure of two or more kinds of the materials. For the insulating material, organic materials, such as a resist material, may be used other than $SiO_2$ and $Al_2O_3$. In the case of using an organic material, the layer 36 can be formed easily by a technique such as spinner coating; it is facilitated to form the layer 36 having a planar surface even when it has to be formed on a non-planar surface. Materials such as polyimide, which is a photosensitive resin, are preferably used for the layer 36 in such a case.

Although in the example shown in FIG. 5, the electro-resistance memory element is constructed by combining an electro-resistance element and a MOS-FET, the configuration of the electro-resistance memory of the present invention is not limited to the example in FIG. 5. It also may be constructed, for example by combining the electro-resistance element of the present invention with an arbitrary semiconductor element, such as other types of transistors or diodes, as a selective element.

Although the memory element 31 shown in FIG. 5 has a structure in which the element 1 is disposed directly on the transistor 21, the transistor 21 may be disposed at distant locations from the element 1 and the lower electrode 2 and the drain 23 may be connected electrically by an extraction electrode. While the element 1 and the transistor 21 are preferably disposed apart from each other to simplify the manufacturing processes of the memory element 31, the area occupied by the memory element 31 can be made smaller and therefore it is possible to realize an electro-resistance memory array with a higher density by disposing the element 1 directly on the transistor 21 as shown in FIG. 5.

Information may be recorded into the memory element 31 by applying a predetermined voltage or current to the element 1, and the information recorded in the element 1 may be, for example, read by altering the magnitude of the voltage or current applied to the element 1 from that when recorded.

An example of how to apply a pulsed voltage to the element 1 as a method of recording and reading information is illustrated with reference to FIG. 6.

Figure 6:
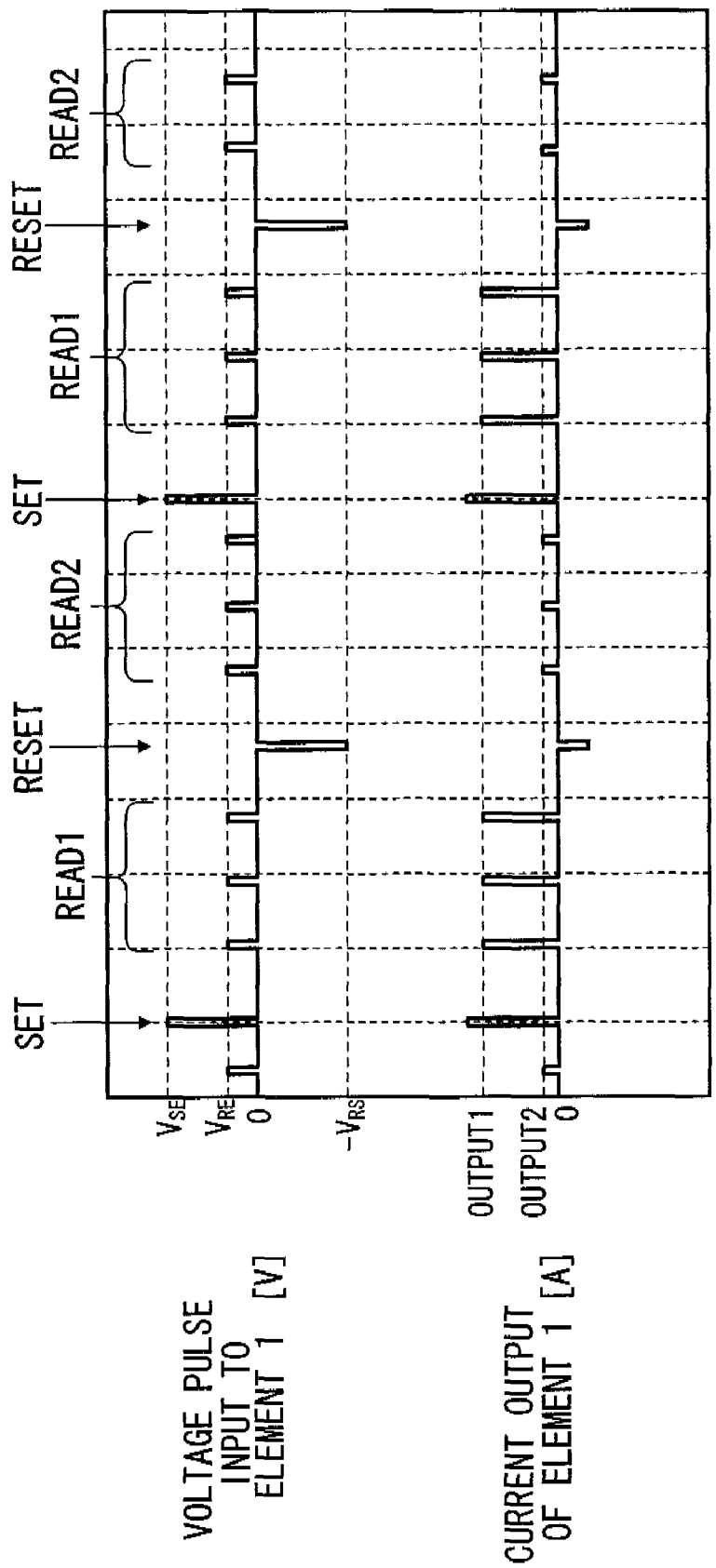
FIG. 6 is a chart for illustrating an example of the information recording and reading method in the electro-resistance memory provided with the electro-resistance element of the present invention.

In the example shown in FIG. 6, the electro-resistance element 1 has such resistance change characteristics that its state is switched from a state A, where the electric resistance is relatively large, into a state B, where the electric resistance is relatively small, by applying a positive bias voltage having a magnitude of a certain threshold value ($V_0$) or greater and that it is switched from the state B into the state A by applying a negative bias voltage having a magnitude of a certain threshold value ($V_0'$) or greater The positive bias voltage is defined as a voltage such that the potential of the upper electrode 4 compared to that of the lower electrode 2 becomes positive, and the negative bias voltage is a voltage such that the potential of the upper electrode 4 compared to that of the lower electrode 2 becomes negative. The magnitude of each bias voltage corresponds to the magnitude of the potential difference between the lower electrode 2 and the upper electrode 4.

In a case that the initial state of the element 1 is the state A, the element 1 is switched from the state A into the state B (SET in FIG. 6) upon applying a positive bias voltage $V_{SE}$ ($|V_{SE}| \geq V_0$) in a pulse form between the lower electrode 2 and the upper electrode 4. The positive bias voltage applied here is denoted as SET voltage.

Here, the electric resistance value of the element 1 can be detected as a current output of the element 1 by applying a positive bias voltage that is smaller than the SET voltage and whose magnitude is less than $V_0$ to the element 1 (READ1 and OUTPUT1 in FIG. 6). The electric resistance value of the element 1 also can be detected by applying a negative bias voltage, the magnitude of which is less than $V_0'$ to the element 1. These voltages applied for detecting the electric resistance value of the element 1 are denoted as READ voltage ($V_{RE}$). The READ voltage may be in a pulse form, as shown in FIG. 6, in which it is possible to reduce the power consumption and to improve the switching efficiency in the memory element 31 similar to the case of the SET voltage in a pulse form. As applying the READ voltage does not change the state of the element 1 (state B), the identical electric resistance value can be detected even when the READ voltage is applied a plurality of times.

Then, the element 1 is switched from the state B into the state A (RESET in FIG. 6) by applying a negative bias voltage $V_{RS}$ ($|V_{RS}| \geq V_0'$) in a pulse form between the lower electrode 2 and the upper electrode 4. The negative bias voltage applied here is denoted as RESET voltage.

Again, the electric resistance value of the element 1 can be detected as the current output of the element 1 by applying the READ voltage to the element 1 (READ2 and OUTPUT2 in FIG. 6). In this case as well, as applying the READ voltage does not change the state of the element 1 (state A), the identical electric resistance value can be detected even when the READ voltage is applied a plurality of times.

Thus, it is possible to record and read information to the memory element 31 by applying a voltage in a pulse form, and the magnitude of the output current from the element 1 obtained by reading varies corresponding to the state of the element 1. When the state of the output current being relatively large (OUTPUT1 in FIG. 6) is defined as "1" and that of relatively small (OUTPUT2 in FIG. 6) is defined as "0", it becomes possible to make the memory element 31 as an memory element that records the information "1" by the SET voltage and records the information "0", or erases the information "1", by the RESET voltage.

To apply a voltage in a pulse form to the element 1 in the memory element 31 shown in FIG. 5, the transistor 21 may be turned ON by the word line; a voltage may be applied through the bit line 32.

The magnitude of READ voltage may be generally in the range of ¼ to 1/1000 of that of SET and RESET voltages. Specific values of the SET and RESET voltages are normally within the range of 0.1 V to 20 V, preferably within the range of from 1 V to 12 V, while they are subject to be dependent on the configuration of the element 1.

Figure 7:
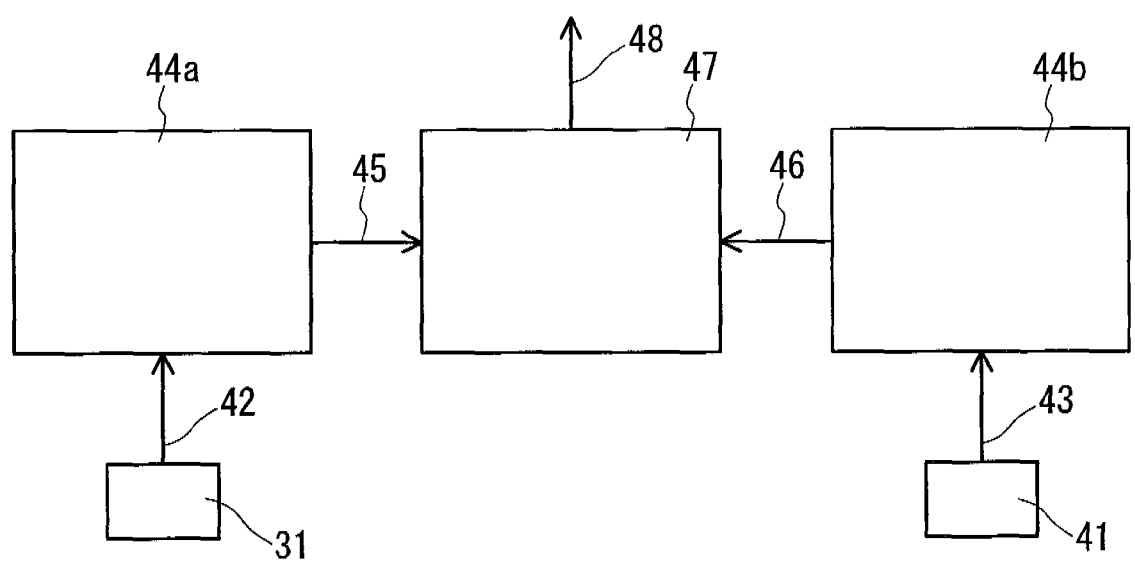
FIG. 7 is a chart for illustrating an example of the information reading method in the electro-resistance memory provided with the electro-resistance element of the present invention.

Detecting the electric resistance value of the element 1 is preferably performed by preparing a reference element separately from the element to be detected and detecting a difference between the value of the element to be detected, such as an output current value, and a reference resistance value, such as a reference output current value, obtained by applying the READ voltage to the reference element in the same manner. FIG. 7 illustrates a method to detect an output signal 48 obtained by a differential amplification circuit 47; an output 45 obtained by amplifying an output 42 from the memory element 31 by a negative feedback amplification circuit 44a and an output 46 obtained by amplifying an output 43 from a reference element 41 by a negative feedback amplification circuit 44b are input to the circuit 47.

Figure 8:
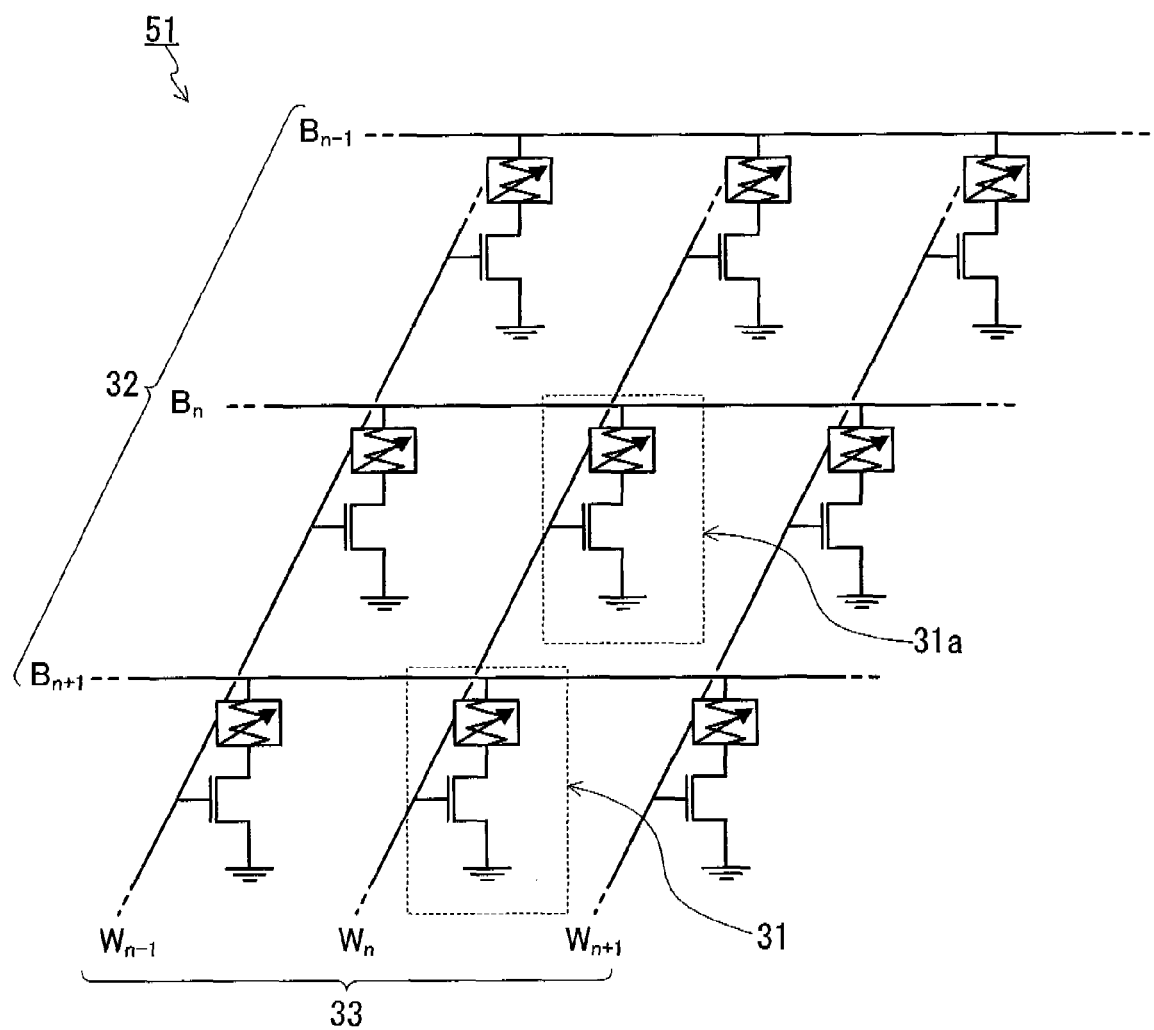
FIG. 8 is a schematic view illustrating an example of the electro-resistance memory (array) provided with the electro-resistance element of the present invention.

A non-volatile random access electro-resistance memory (array) 51 can be constructed when two or more memory elements 31 are aligned in a matrix, as shown in FIG. 8. The memory array 51 achieves recording and reading information to and from a memory element 31a, which is located at a coordinate ($B_n$, $W_n$) by selecting a bit line ($B_n$) from two or more bit lines 32 and a word line ($W_n$) from two or more word lines 33.

As shown in FIG. 8, at least one memory element 31 may be a reference element when two or more memory elements 31 are aligned in a matrix.

Figure 9:
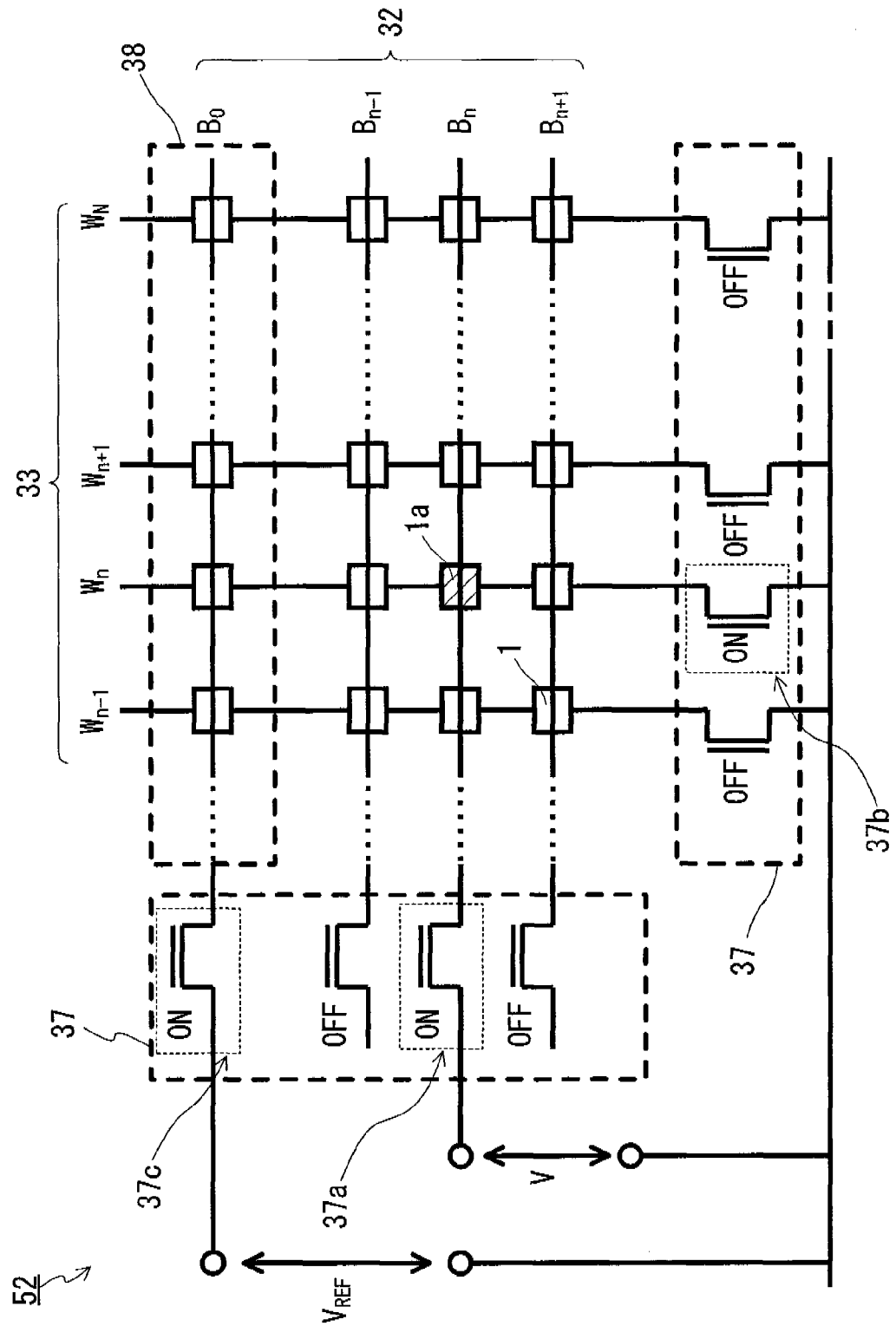
FIG. 9 is a schematic view illustrating another example of the electro-resistance memory (array) provided with the electro-resistance element of the present invention.

As shown in FIG. 9, a non-volatile random access electro-resistance memory (array) 52 may be constructed by using pass transistors 37 and aligning two or more electro-resistance elements 1 in a matrix. In the memory array 52, the bit lines 32 are connected electrically to the lower electrodes 2 of the elements 1, and the word lines 33 to the upper electrodes 4 of the elements 1. The memory array 52 achieves recording and reading information to and from an electro-resistance element 1a, which is located at a coordinate ($B_n$, $W_n$) by selectively turning ON a pass transistor 37a that is connected to a bit line ($B_n$) selected from the two or more bit lines 32 and a pass transistor 37b that is connected to a word line ($W_n$) selected from the two or more word lines 33. Reading information from the element 1a is possible by, for example, measuring the voltage V shown in FIG. 9, which is the voltage corresponding to the electric resistance value of the element 1a. A reference element group 38 is disposed in the memory array 52 shown in FIG. 9, and the difference between the outputs from the element 1a and from the group 38 can be detected by selectively turning ON a pass transistor 37c corresponding to a bit line ($B_0$) connected to the group 38 and measuring the voltage $V_{REF}$ shown in FIG. 9.

In addition, the memory array 52 in FIG. 9 allows using the elements 1 that were not selected by the pass transistor 37 as the reference elements. Such a method facilitates configuration of the memory array, although the operation as a memory array may become somewhat slower because the reference elements have to be assigned appropriately while the states of the elements on the vicinity of the elements 1a selected by the pass transistor 37 are verified.

Figure 10:
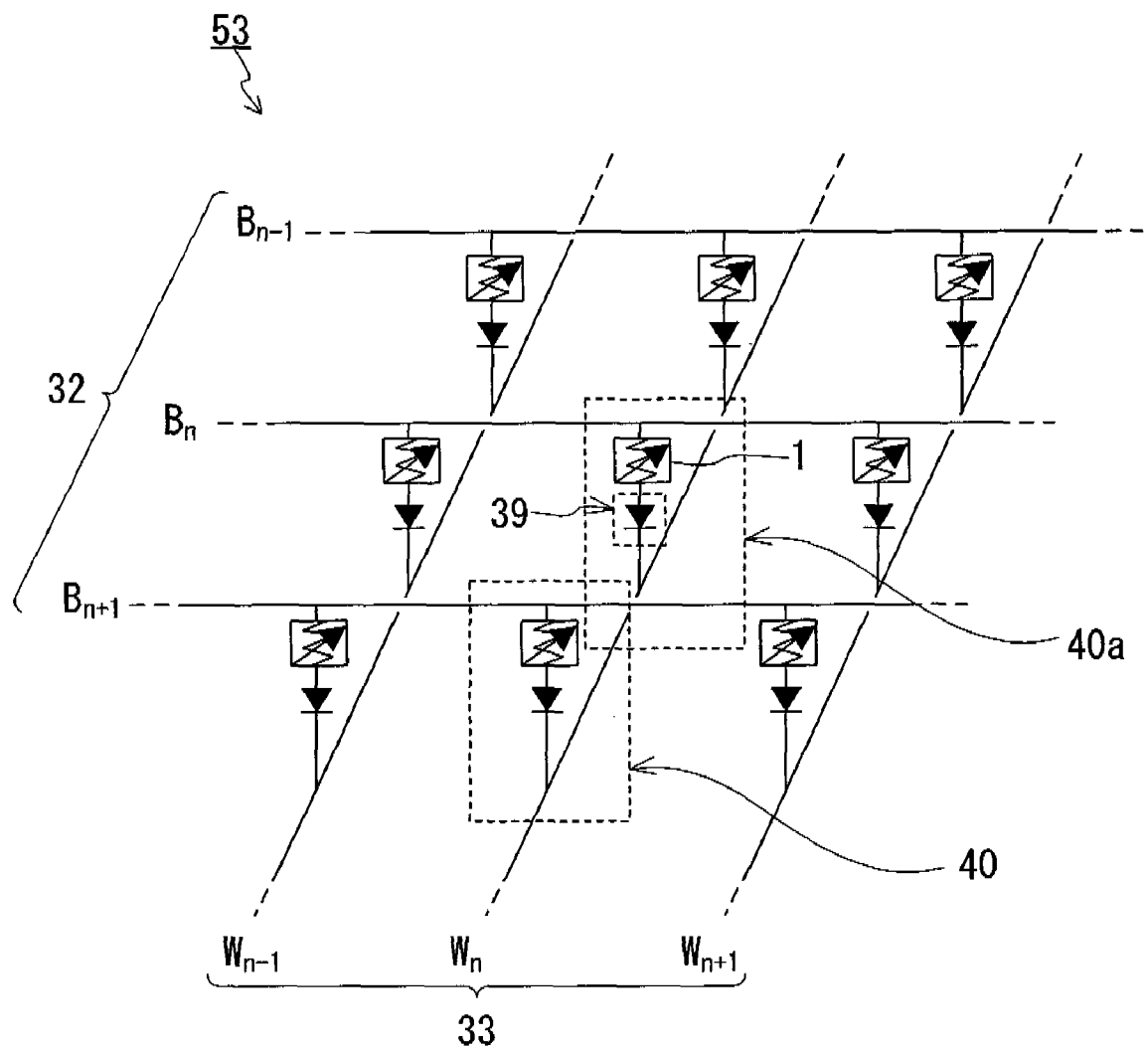
FIG. 10 is a schematic view illustrating still another example of the electro-resistance memory (array) provided with the electro-resistance element of the present invention.

A non-volatile random access electro-resistance memory (array) 53 can be constructed by aligning two or more of memory elements 40 in a matrix, which is made by combining the elements 1 of the present invention and selective elements 39 (diodes in FIG. 10 as an example) having non-linear current-voltage characteristics (I-V characteristics), as shown in FIG. 10.

The memory elements 40 in FIG. 10 achieve reduction of wraparound resistance via the selective elements 39 by electrically connecting the elements 1 and the selective elements 39 in series between the bit lines 32 and the word lines 33.

An element having a p-n junction, a p-i-n junction or a Schottky junction is preferred as the selective element 39. The p-n junction may be a junction of an n-type semiconductor, such as $TiO_2$:M (hereinafter M is defined as doped elements of transition metals) as an example of Magneli compounds, $SnO_2$:M or ZnO:M, and a p-type semiconductor, such as $NiO_{1-d}$ (hereinafter d is defined as oxygen deficiency in the range of 0 to 0.1), $Cu_2O_{1-d}$ or $FeO_p$:M (p is in the range of 1 to 1.5) as examples of spinel compounds. Such p-n junction formed by the n-type and p-type semiconductors is easily formed on a doped Si substrate. It may also be a p-n junction, such as ZnAlO/p-Si and ZnO/NiO. An example of the p-i-n junction may be ZnAlO/$Al_2O_3$/p-Si, and that of the Schottky junction may be ZnAlO/ZnO. These junctions have diode-like nonlinear I-V characteristics.

The elements having these junctions also facilitate forming, for example, cross point memory elements 40 shown in FIG. 16 described below because such elements can be formed in self-aligning by the similar processes as the elements of the present invention.

Hereinafter, the manufacturing methods of the present invention are illustrated.

In the first method of manufacturing, after forming the lower electrode 6 on the substrate 12, the iron oxide film 5 including $Fe_3O_4$ is formed on the electrode 6. Then, the electro-resistance layer 3, having a different composition from the film 5 and including $Fe_2O_3$, and $Fe_3O_4$ contained in an amount of 0% to 20% of $Fe_2O_3$ in percent by weight, is formed on the film 5 to make contact with each other.

The first method allows forming the film 5 made of $Fe_3O_4$ in forming an iron oxide film step.

The first method also allows forming the layer 3 made of an iron oxide or that made of $Fe_2O_3$ and $Fe_3O_4$ in forming an electro-resistance layer step. It further allows forming the layer 3 made of $Fe_2O_3$.

The first method still further allows forming the film 5 and the layer 3 in the case where the film 5 made of $Fe_3O_4$ is formed in the forming an iron oxide film step and the layer 3 made of an iron oxide in the forming an electro-resistance layer step according to the following manner: an identical raw material containing iron and oxygen is used in the forming an iron oxide film step and the forming an electro-resistance layer step, and a ratio $P_{oxy}/P_{inert}$ between partial pressure $P_{inert}$ of an inert gas and partial pressure $P_{oxy}$ of oxygen in an atmosphere in the forming an electro-resistance layer step is made larger than the ratio in an atmosphere in the forming an iron oxide film step. The layer 3 including $Fe_2O_3$ has more atoms of oxygen per atoms of iron compared to the film 5 made of $Fe_3O_4$. Thus, the film 5 and the layer 3 can be formed by changing the partial pressure of oxygen in the atmosphere of each formation, which means, more specifically, to make the partial pressure of oxygen in the forming an electro-resistance layer step larger than that in the forming an iron oxide film step. The layer 3 formed here may be made of either $Fe_2O_3$ and $Fe_3O_4$, or $Fe_2O_a$.

The method also may be described that the film 5 is formed in a condition A1 where the partial pressure of oxygen is relatively low and the layer 3 is formed in a condition A2 where it is relatively high. It allows changing from the condition A1 into the condition A2 either in a continuous manner or in a stepwise manner.

The raw material is, for example, a so-called evaporation source in the case where the film 5 and the layer 3 are formed by an evaporation method, such as molecular beam epitaxial method (MBE), or an ion plating method. It is, for another example, a so-called target in the case where the film 5 and the layer 3 are formed by the various sputtering methods.

The composition of the raw material including iron and oxygen is not particularly limited, and can be configured in accordance with the composition of the layer 3 to be formed. The raw material is also allowed to have a composition, for example, represented by the formula $FeO_x$ ($1/2 \leq x < 4/3$), and such raw material is particularly preferable in the case of forming the layer 3 made of $Fe_2O_3$.

The first method still further allows forming the film 5 and the layer 3 in the case where the film 5 made of $Fe_3O_4$ is formed in the forming an iron oxide film step and the layer 3 made of an iron oxide in the forming an electro-resistance layer step according to the following manner: the layer 3 made of an iron oxide is formed in the forming an electro-resistance layer step by oxidizing the surface of the film 5 formed in the forming an iron oxide film step. The layer 3 formed here may be made of either $Fe_2O_3$ and $Fe_3O_4$, or $Fe_2O_3$. The composition of the layer 3 may be controlled by adjusting the degree of the oxidization.

The manner of oxidization is not particularly limited, and for example, it is allowed making contact with the surface of the formed film 5 and oxygen for natural oxidization of the surface. During the process, a temperature of the substrate 12 on which the film 5 is formed may be controlled, as needed. The time to oxidize the surface of the film 5 may be set appropriately.

As oxygen to be made contact with the surface of the film 5, oxygen in various states, such as ions, radicals, plasma and atoms, or ozone ($O_3$) may be used other than oxygen atom ($O_2$). Radicals and ozone are in particular advantageous in improving the oxidization rate and enabling oxidization of the film at a lower temperature for their high activities and strong oxidization. That is, oxidization by radicals and ozone is more preferable than a general thermal oxidization for enabling oxidization minimizing its adverse effects on the grain size. To create oxygen plasma and oxygen radicals, various methods can be employed, such as electron cyclotron resonance (ECR) discharge, glow discharge, RF discharge, helicon and inductively coupled plasma (ICP).

In the first method, any arbitrary step may be added among the steps of forming a lower electrode, forming an iron oxide film, forming an electro-resistance layer and forming an upper electrode.

In the second method of manufacturing, after forming the lower electrode 2 made of an iron oxide (a first iron oxide) on the substrate 12, the layer 3 having a different composition from the first iron oxide and including $Fe_2O_3$, and $Fe_3O_4$ contained in an amount of 0% to 20% of $Fe_2O_3$ in percent by weight is formed on the lower electrode 2 to make contact with each other.

In the second method, the first iron oxide may be $Fe_3O_4$, i.e. the lower electrode 2 made of $Fe_3O_4$ may be formed in the forming a lower electrode step.

The second method allows the layer 3 to be made of an iron oxide (a second iron oxide having a different composition from the first iron oxide) or to be made of $Fe_2O_3$ and $Fe_3O_4$ in the forming an electro-resistance layer step. It also allows forming the layer 3 made of $Fe_2O_3$.

The second method allows forming the lower electrode 2 and the layer 3 in the following manner in the case that the first iron oxide is $Fe_3O_4$, i.e. the lower electrode 2 made of $Fe_3O_4$ is formed in the forming a lower electrode step, and that the layer 3 made of the second iron oxide is formed in the forming an electro-resistance layer step: an identical raw material containing iron and oxygen is used in the forming a lower electrode step and the forming an electro-resistance layer step, and a ratio $P_{oxy}/P_{inert}$ between partial pressure $P_{inert}$ of an inert gas and partial pressure $P_{oxy}$ of oxygen in an atmosphere in the forming an electro-resistance layer step is made larger than the ratio in an atmosphere in the forming a lower electrode step. The layer 3 including $Fe_2O_3$ has more atoms of oxygen per atoms of iron compared to the lower electrode 2 made of $Fe_3O_4$. Thus, the lower electrode 2 and layer 3 can be formed by changing the partial pressure of oxygen under the atmosphere upon forming the lower electrode from that upon forming the electro-resistance layer, which means, more specifically, to make the partial pressure of oxygen in the forming an electro-resistance layer step larger than that in the forming a lower electrode step. The layer 3 formed here may be made of either $Fe_2O_3$ and $Fe_3O_4$, or $Fe_2O_3$.

The method also may be described that the lower electrode 2 is formed in a condition B1 where the partial pressure of oxygen is relatively low and forms the layer 3 in a condition B2 where it is relatively high. It allows changing from the condition B1 into the condition B2 either in a continuous manner or in a stepwise manner.

The raw material is, for example, a so-called evaporation source in the case where the lower electrode 2 and the layer 3 are formed by an evaporation method, such as molecular beam epitaxial method (MBE), or an ion plating method. It is, for another example, a so-called target in the case where the lower electrode 2 and the layer 3 are formed by the various sputtering methods.

The composition of the raw material including iron and oxygen is not particularly limited, and can be configured in accordance with the composition of the layer 3 to be formed. The raw material is also allowed to have a composition, for example, represented by the formula $FeO_x$ ($1/2 \leq x < 4/3$), and such raw material is particularly preferable in the case of forming the layer 3 made of $Fe_2O_3$.

The second method further allows forming the lower electrode 2 and the electro-resistance layer 3 in the following manner in the case that the first iron oxide is $Fe_3O_4$, i.e. the lower electrode 2 made of $Fe_3O_4$ is formed in the forming a lower electrode step, and that the layer 3 made of the second iron oxide is formed in the forming an electro-resistance layer step: the layer 3 made of the second iron oxide is formed in the forming an electro-resistance layer step by oxidizing a surface of the lower electrode 2 formed in the forming a lower electrode step. The layer 3 formed here may be made of either $Fe_2O_3$ and $Fe_3O_4$, or $Fe_2O_3$. The composition of the layer 3 may be controlled by adjusting the degree of the oxidization.

The manner of oxidization is not particularly limited, and for example, it is allowed by making contact between the surface of the formed lower electrode 2 and oxygen for natural oxidization of the surface. During the process, a temperature of the substrate 12 on which the lower electrode 2 is formed may be controlled as needed. The time to oxidize the surface of the lower electrode 2 may be set appropriately.

As oxygen to be made contact with the surface of the lower electrode 2, oxygen in various states, such as ions, radicals, plasma and atoms, may be used other than oxygen atom ($O_2$). To create oxygen plasma and oxygen radicals, various methods can be employed, such as electron cyclotron resonance (ECR) discharge, glow discharge, RF discharge, helicon and inductively coupled plasma (ICP).

In the second method, any arbitrary step may be added among the steps of forming a lower electrode, forming an electro-resistance layer and forming an upper electrode.

The lower electrode 2, the electro-resistance layer 3, the upper electrode 4, the iron oxide film 5 and the lower electrode 6 may be formed by applying manufacturing processes of semiconductors, such as common thin-film forming and micro-fabricating processes. For example, various sputtering techniques, such as pulse laser deposition (PLD), ion beam deposition (IBD), cluster ion beam, RF, DC, electron cyclotron resonance (ECR), helicon, inductively coupled plasma (ICP), and facing target sputtering, evaporation methods, such as molecular beam epitaxy (MBE), and ion plating may be employed. Other than these PVD (Physical Vapor Deposition) techniques, it is also possible to employ CVD (Chemical Vapor Deposition), MOCVD (Metal Organic Chemical Vapor Deposition), a plating method, MOD (Metal Organic Decomposition), or a sol-gel method.

For the micro-fabrication of the layers, the following techniques, which are commonly used in the manufacture processes for semiconductors and magnetic devices (for example, magnetoresistive elements such as GMR and TMR), may be used in combination: physical or chemical etching such as ion milling, RIE (Reactive Ion Etching), and FIB (Focused Ion Beam), and photolithography techniques using a stepper for forming micro patterns and an EB (Electron Beam) technique. The planarization of the layers may be performed by, for example, CMP (Chemical Mechanical Polishing), cluster-ion beam etching, or the like.

The same techniques may be applied for deposition, micro-fabricating and planarization of protective insulation films, barrier metals and plug metals described below. Electronic devices, such as memory elements and memory arrays having an electro-resistance element of the present invention, may be formed in the same manner.

An example of the method of manufacturing of the present invention is shown in FIGS. 11A to 11H, as an example of that of manufacturing a memory element in which the electro-resistance element of the present invention is incorporated.

Figure 11A:
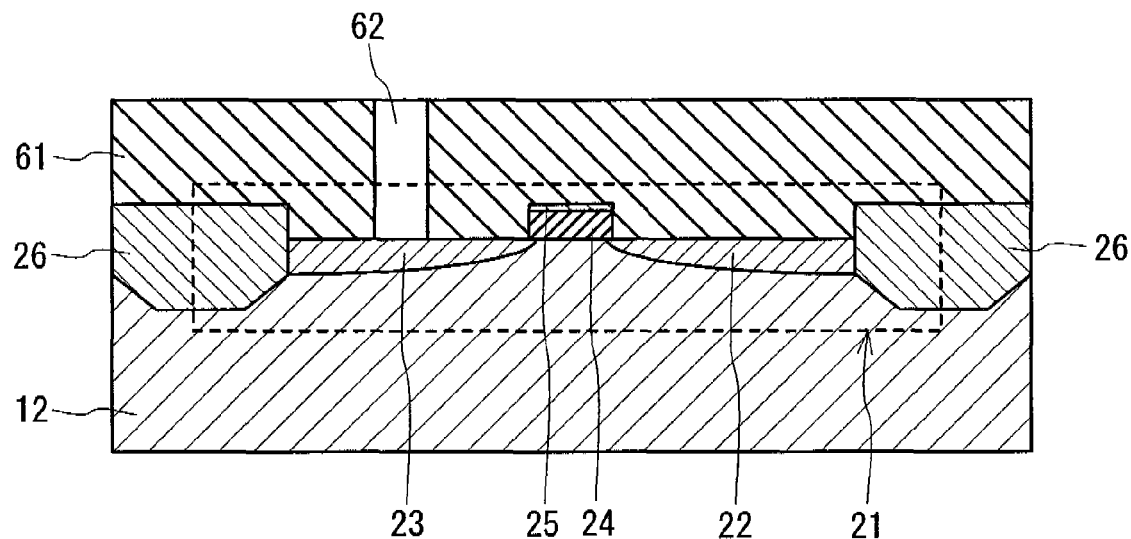
FIGS. 11A to 11H are process drawings schematically illustrating an example of the method of manufacturing an electro-resistance element according to the present invention.

First, as shown in FIG. 11A, a protective insulation film 61 is deposited to overlay a transistor 21 on a surface of a substrate 12 on which the transistor 21 is formed. After planarizing the surface of the deposited film 61 by a technique such as CMP, an opening 62 for a plug is formed by selectively etching through the film 61.

The film 61 may be made of, for example, SiO$_2$, and more specifically SiO$_2$ film (TEOS film) formed by TEOS (tetraethyl orthosilicate) and O$_3$ (ozone). Any common technique may be employed for forming the transistor 21 on the surface of the substrate 12. The transistor 21 shown in FIG. 11A is a common MOS-FET including a source 22, a drain 23, a gate insulating film 24, a gate electrode 25 and an element isolating section 26. The opening 62 may be formed to expose the drain 23 of the transistor 21.

Figure 11B:
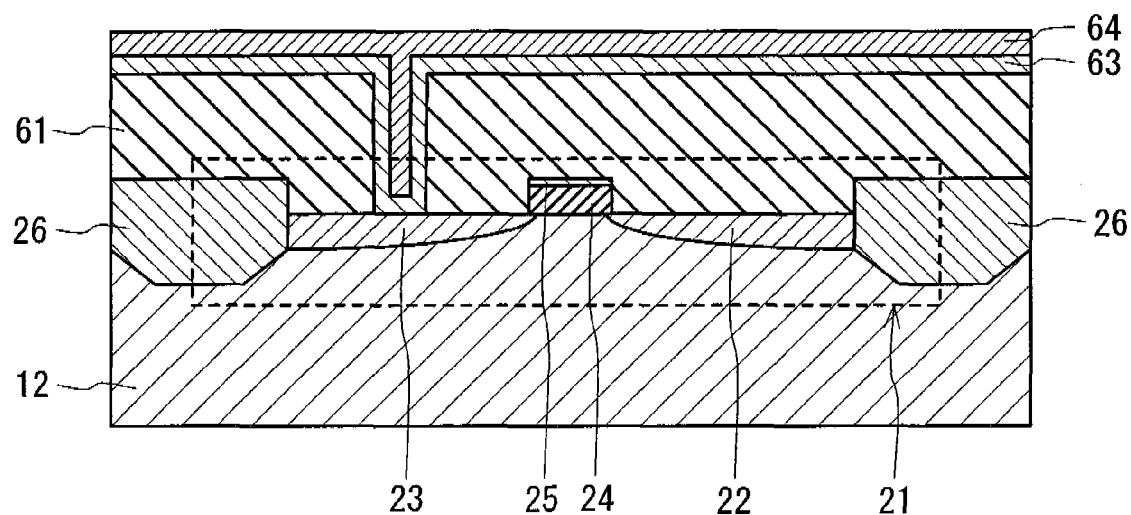

Next, as shown in FIG. 11B, on the surface of the film 61, a barrier metal 63 and a plug metal 64 are deposited in this order. As a material for the barrier metal 63, a material functioning to restrict diffusion of the plug metal 64 or to enhance adhesion with the neighboring insulating layers, or a material functioning as a seed in the case of forming the plug metal 64 by plating, may be used. For example, a stacked structure made of titanium (Ti) film and titanium nitride (Ti—N) film or that made of tantalum (Ta) film and tantalum nitride (Ta—N) film may be used. A material basically having an excellent electrical conductivity for the plug metal 64, such as tungsten, aluminum and copper, may be used. The plug metal 64 may be deposited to fill the opening 62.

Figure 11C:
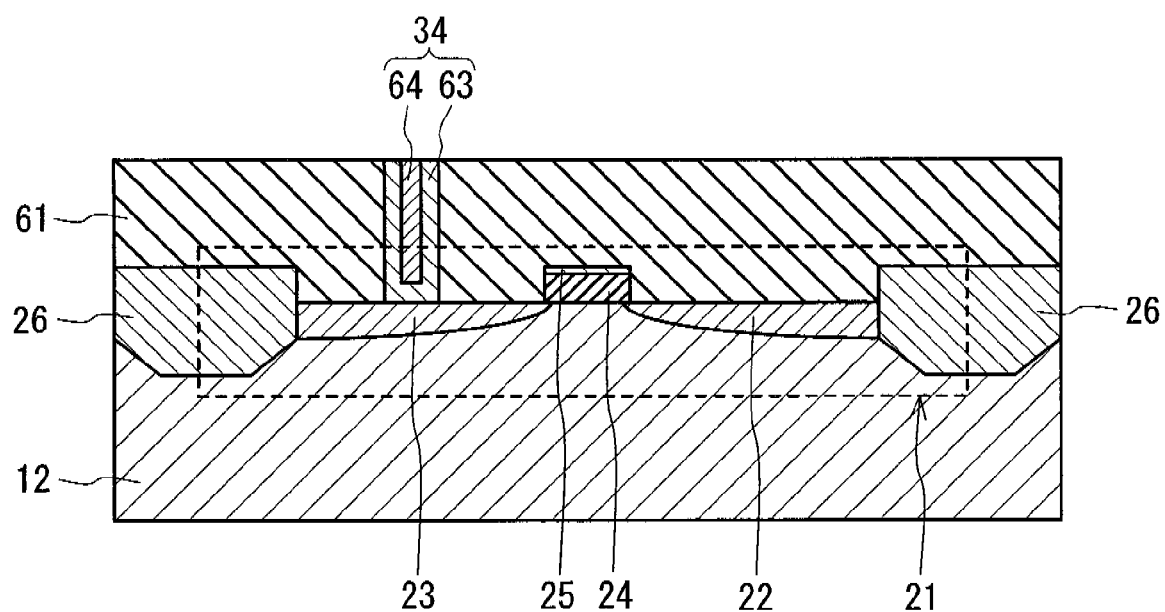

Then, as shown in FIG. 11C, the parts of the deposited barrier metal 63 and the plug metal 64 that were formed on top of the film 61 are removed by a technique such as CMP, so that a plug 34, which is electrically connected to the drain 23, is formed.

Figure 11D:
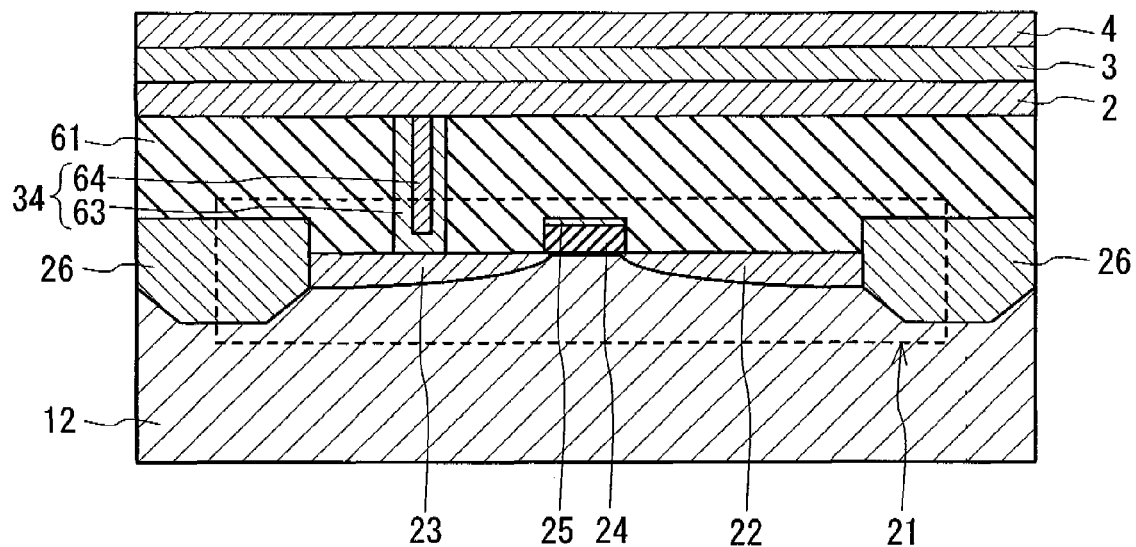

Then, as shown in FIG. 11D, a lower electrode 2, an electro-resistance layer 3 and an upper electrode 4 are formed on the surfaces of the plug 34 and the film 61 in this order. The lower electrode 2 may be formed to secure an electrical connection with the plug 34.

Figure 11E:
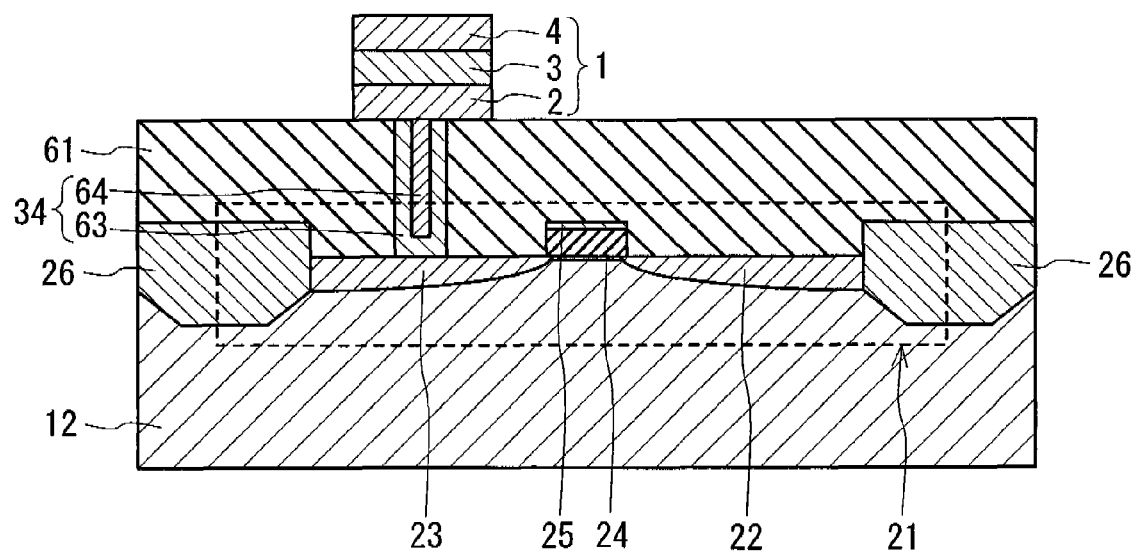

Then, as shown in FIG. 11E, the lower electrode 2, the layer 3 and the upper electrode 4 that were formed are micro-fabricated in predetermined shapes.

Figure 11F:
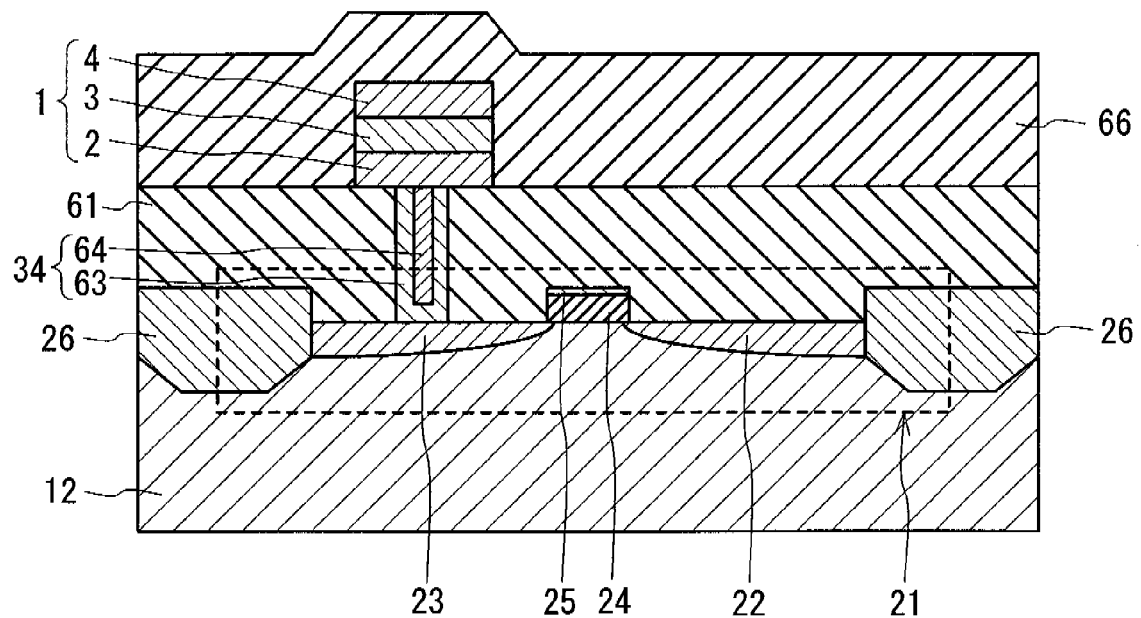

Then, as shown in FIG. 11F, a protective insulation film 66 is deposited on the film 61 to overlay the stacked structure 11 of the lower electrode 2, the layer 3 and the upper electrode 4. The film 66 may be made of the above TEOS film or the like.

Figure 11G:
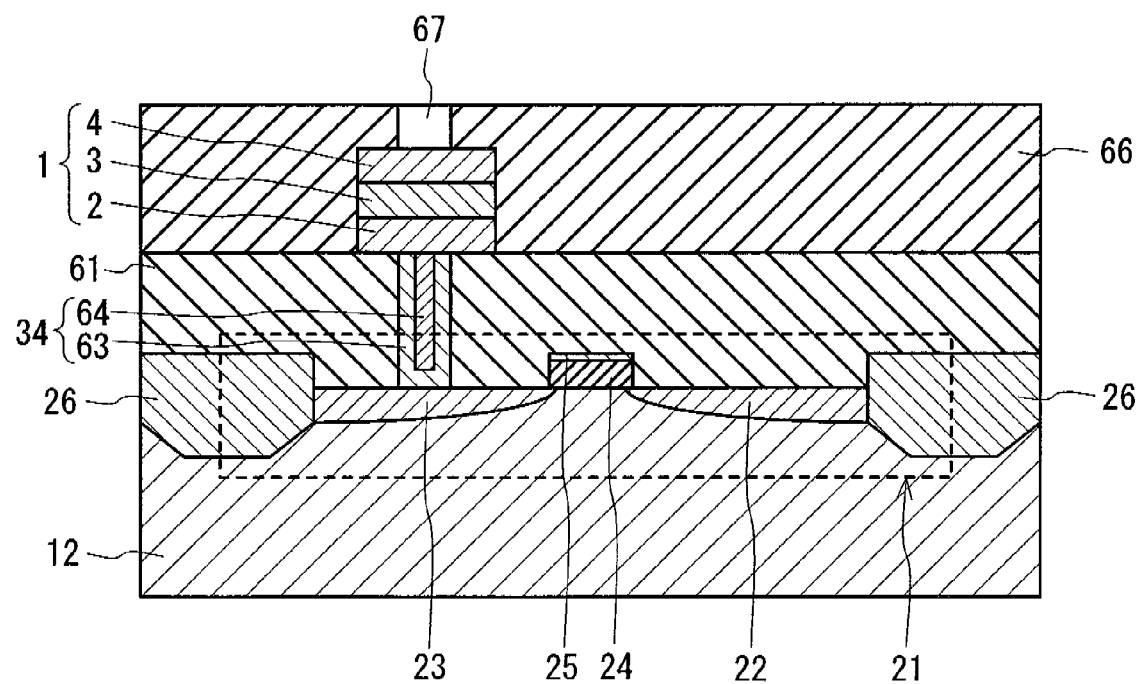

Then, as shown in FIG. 11G, after planarizing the surface of the film 66 by a technique such as CMP, an opening 67 for a plug is formed by selectively etching through the film 66. The opening 67 may be formed to expose the upper electrode 4.

Figure 11H:
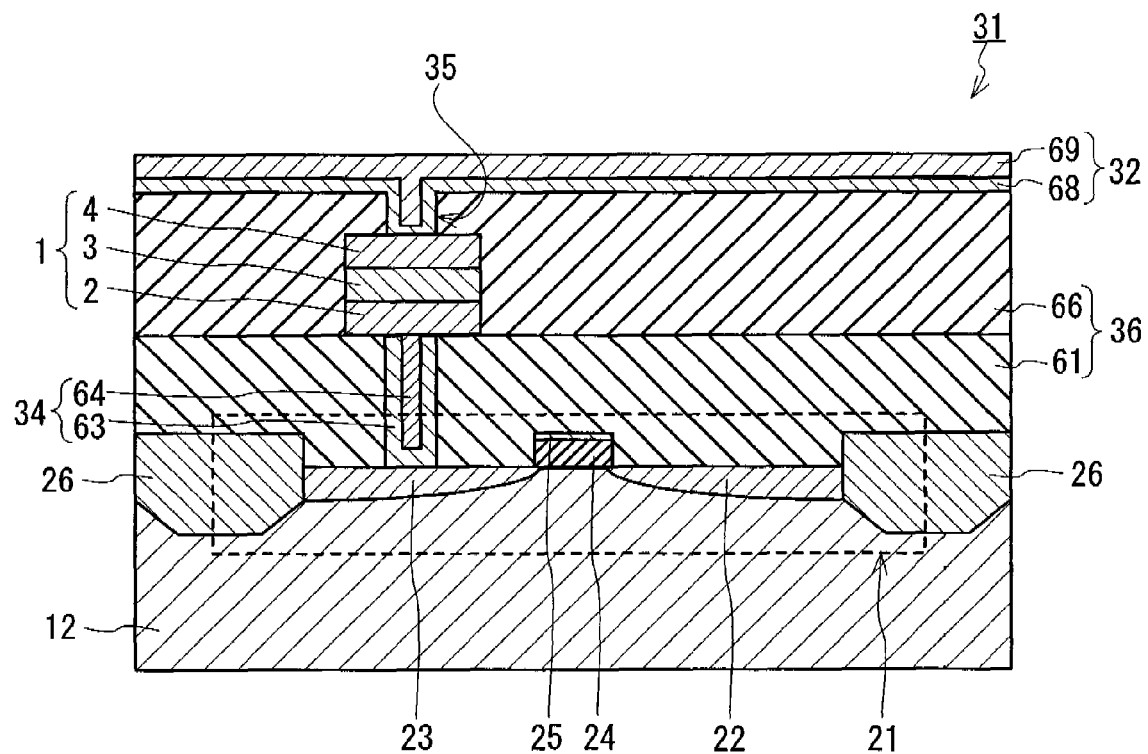

Then, as shown in FIG. 11H, an adhesive metal 68 and a wiring metal 69 are deposited on the surface of the film 66 in this order to form a bit line 32 and a plug 35 electrically connecting the bit line 32 with the upper electrode 4. As a material for the adhesive metal 68, a material functioning to enhance adhesion with the neighboring insulating layers, or a material functioning as a seed in the case of forming the wiring metal 69 by plating, may be used. For example, a stacked structure made of titanium (Ti) film and titanium nitride (Ti—N) film or that made of tantalum (Ta) film and tantalum nitride (Ta—N) film, or nitrocarburized silicon (Si—C—N) may be used. A material basically having an excellent electrical conductivity, such as tungsten, copper and aluminum may be used for the wiring metal 69. The wiring metal 69 may be deposited to fill the opening 67 and to form the bit line 32. In this way, a memory element 31 shown in FIG. 5 can be formed. The films 61 and 66 configure the layer 36 in the FIG. 5.

Another example of the method of manufacturing of the present invention is shown in FIGS. 12A to 12K, as an example of that of manufacturing a memory element in which the electro-resistance element of the present invention is incorporated.

Figure 12A:
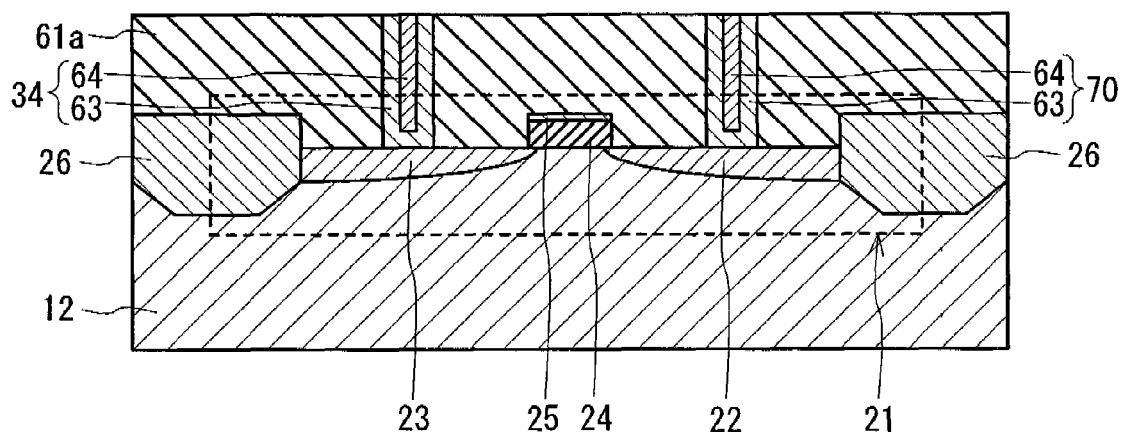
FIGS. 12A to 12K are process drawings schematically illustrating another example of the method of manufacturing an electro-resistance element according to the present invention.

First, similar to the steps shown in FIGS. 11A to 11C, a protective insulation film 61a is deposited on a surface of a substrate 12 on which the transistor 21, which is a MOS-FET, is formed as shown in FIG. 12A. On the deposited film 61a, a plug 34 electrically connected to a drain 23 of the transistor 21 and a plug 70 electrically connected to a source 22 of the transistor 21 are formed. The plug 70 may be formed in the same manner as the plug 34.

Figure 12B:
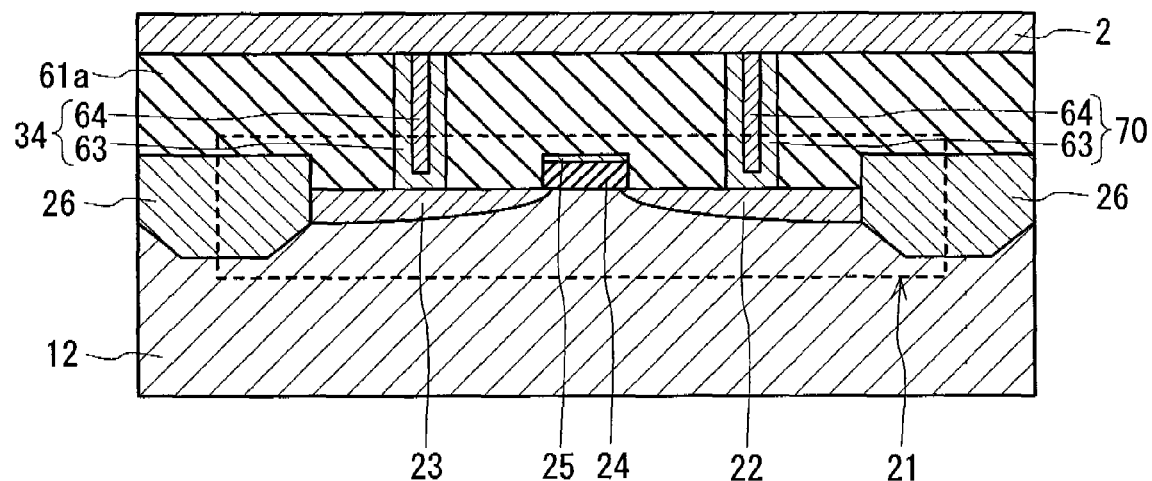

Next, as shown in FIG. 12B, a lower electrode 2 is formed on the film 61a, the plug 34 and the plug 70. The lower electrode 2 may be formed to secure an electrical connection with the plug 34.

Figure 12C:
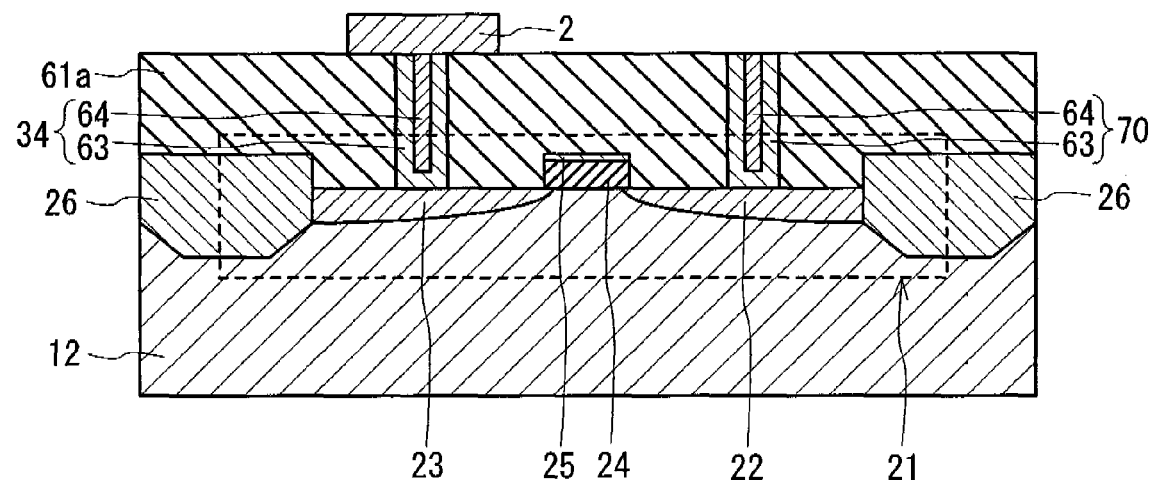

Then, as shown in FIG. 12C, the lower electrode 2 is removed by a technique such as etching except the part right above the plug 34.

Figure 12D:
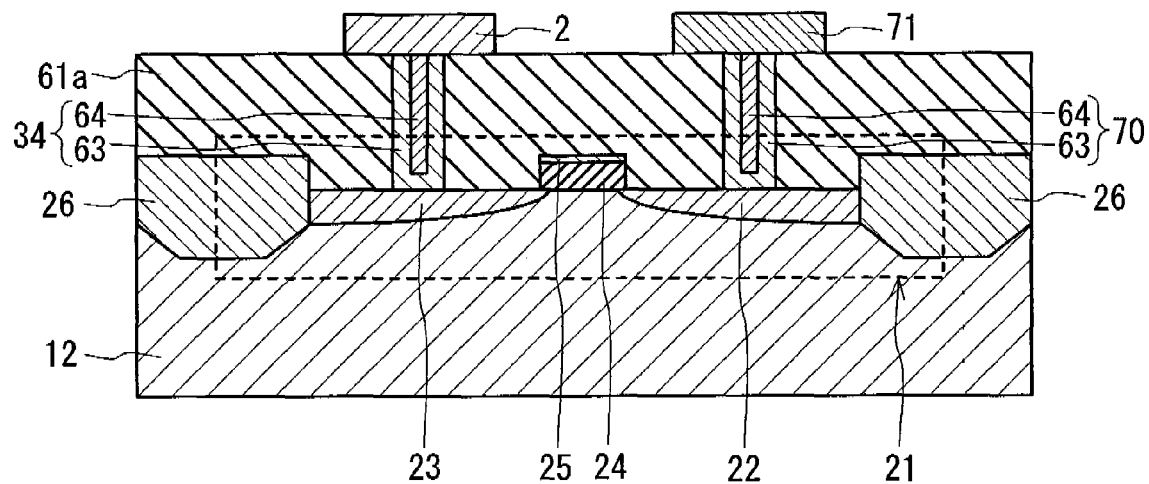

Then, as shown in FIG. 12D, an electrode 71, which connects the source 22 and a bit line 32 to be formed in a later step, is formed on the surface of the plug 70 to secure electrical connection thereto. The electrode 71 basically may be made of a material having an electrical conductivity.

Figure 12E:
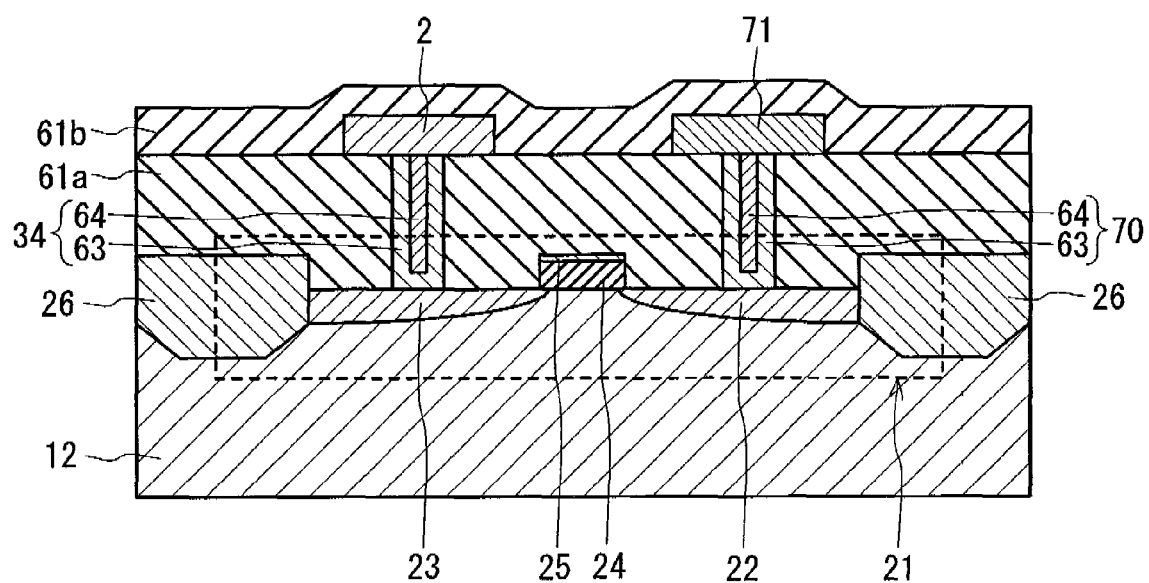
Figure 12F:
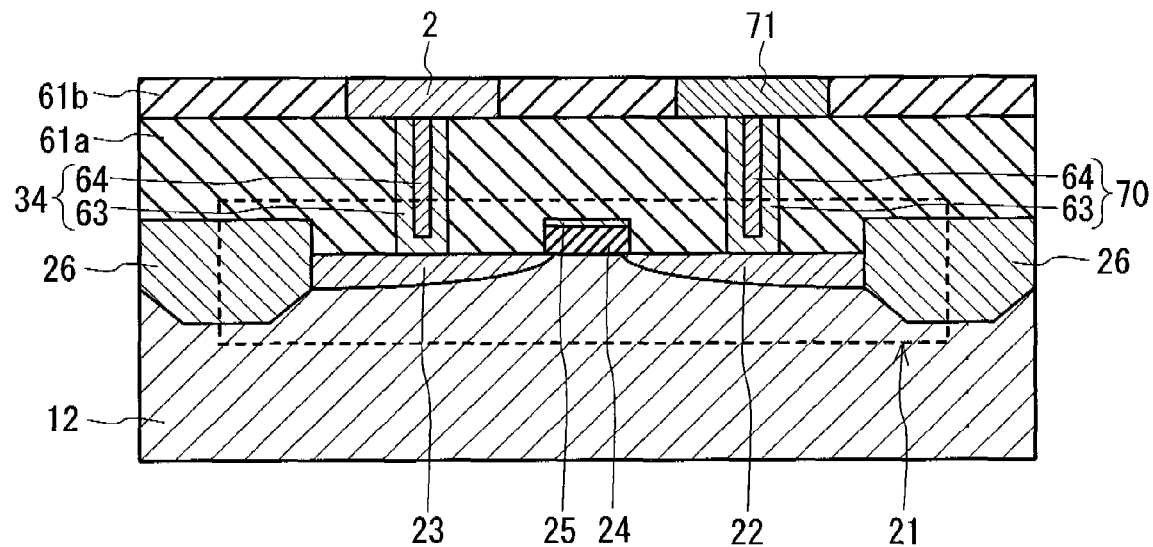

Then, after depositing a protective insulation film 61b on the film 61a to overlay the lower electrode 2 and the electrode 71 as shown in FIG. 12E, the lower electrode 2 and the electrode 71 are exposed after planarizing the surface of the film 61b by a technique such as CMP as shown in FIG. 12F.

Figure 12G:
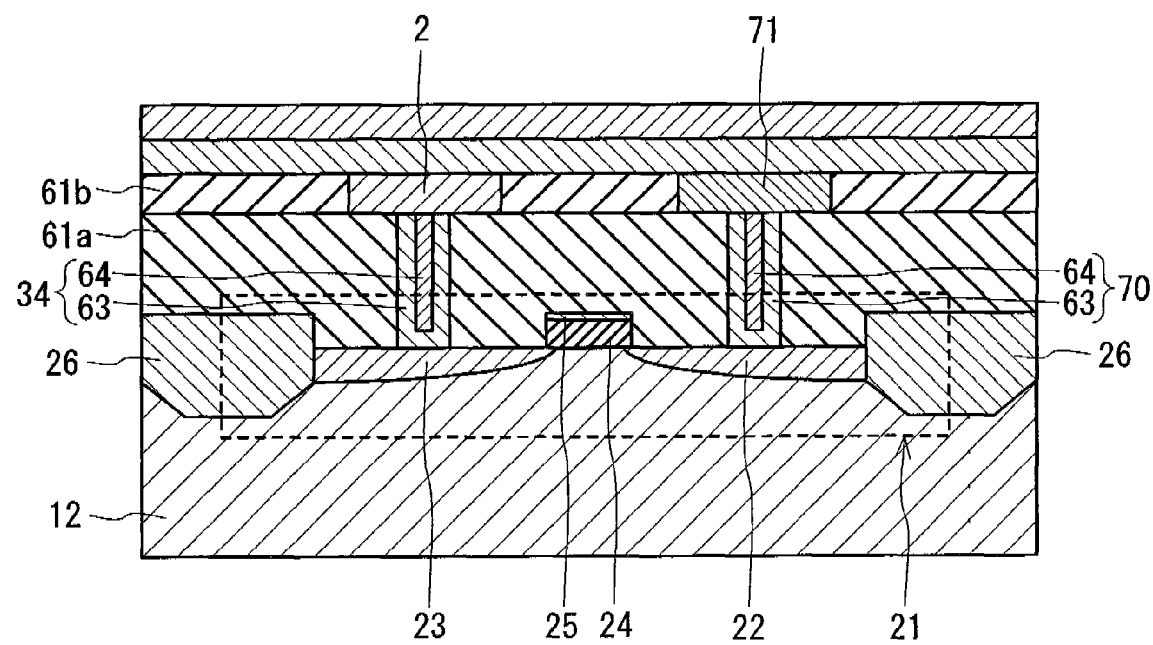

Then, as shown in FIG. 12G, an electro-resistance layer 3 and an upper electrode 4 are formed on the film 61b, the lower electrode 2 and the electrode 71.

Figure 12H:
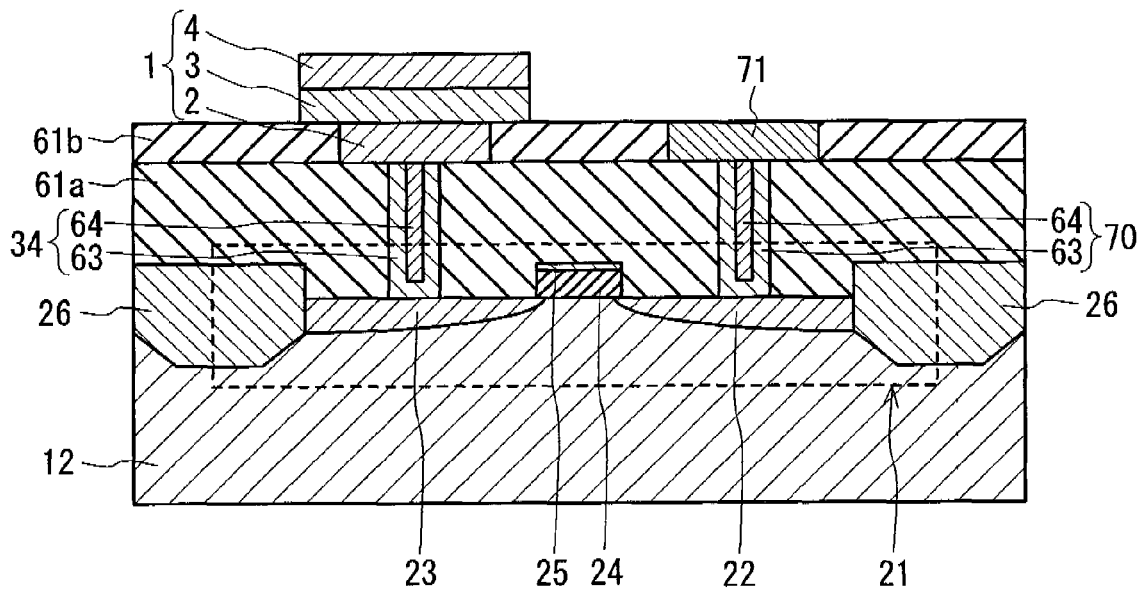

Then, as shown in FIG. 12H, the layer 3 and the upper electrode 4 are micro-fabricated in predetermined shapes.

Figure 12I:
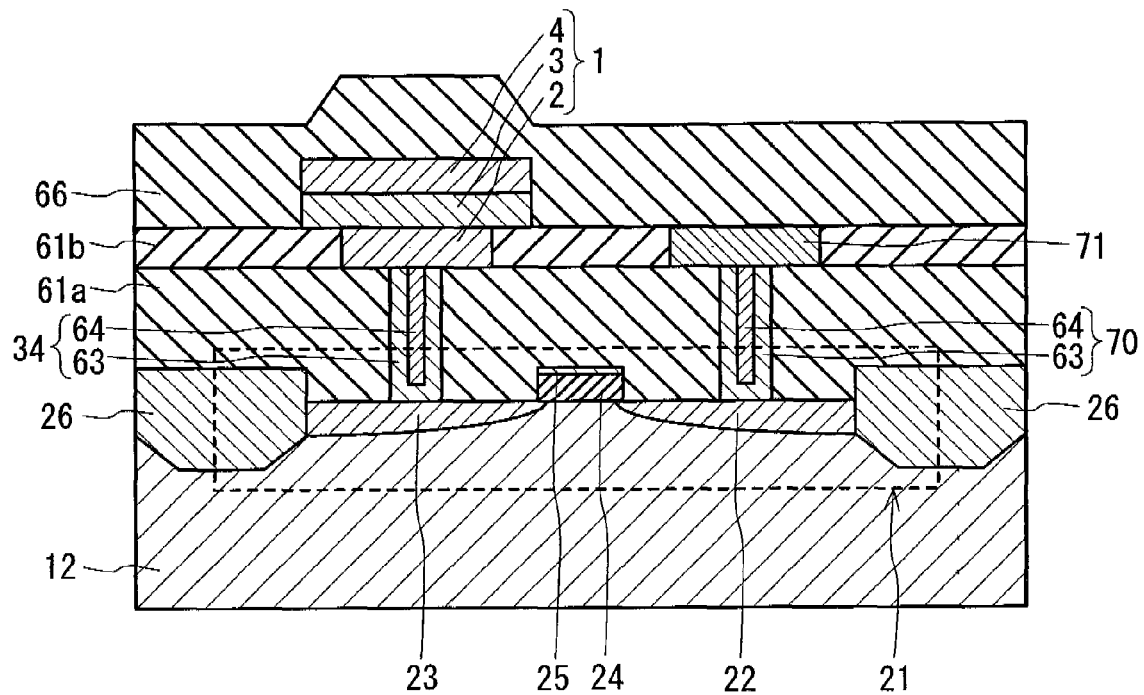

Then, as shown in FIG. 12I, a protective insulation film 66 is formed on the film 61b and the electrode 71 to overlay the layer 3 and the upper electrode 4.

Figure 12J:
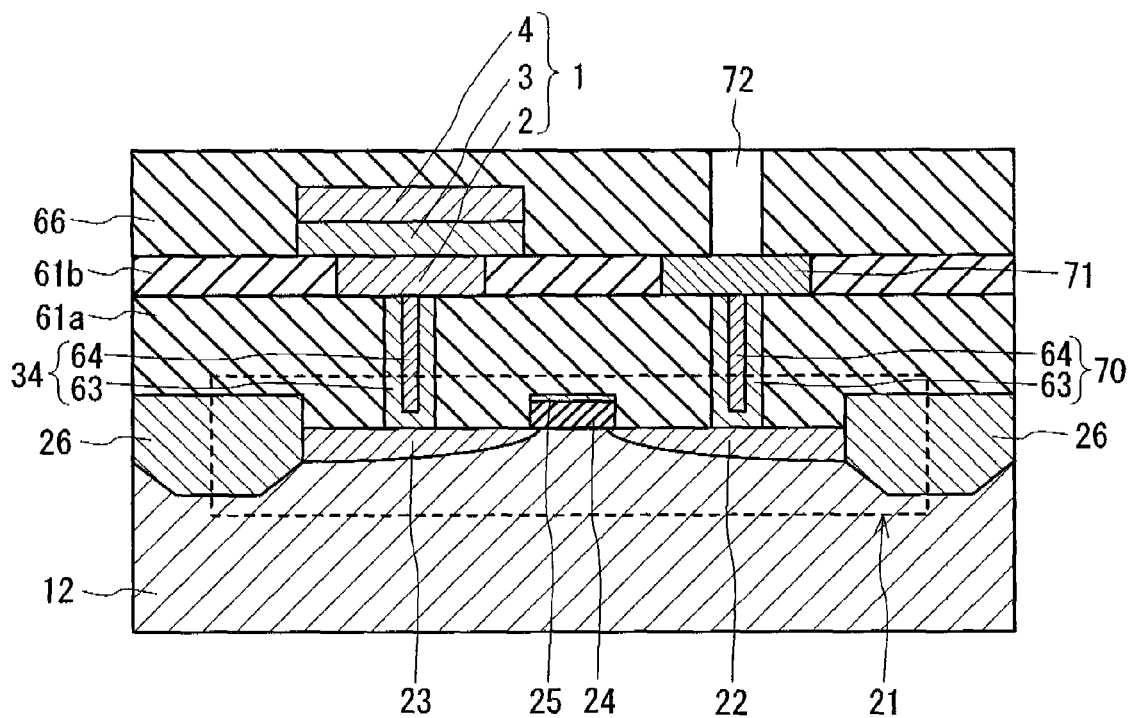

Then, as shown in FIG. 12J, after planarizing the surface of the film 66 by a technique such as CMP, an opening 72 for a plug is formed by selectively etched through the film 66. The opening 72 may be formed to expose the electrode 71.

Figure 12K:
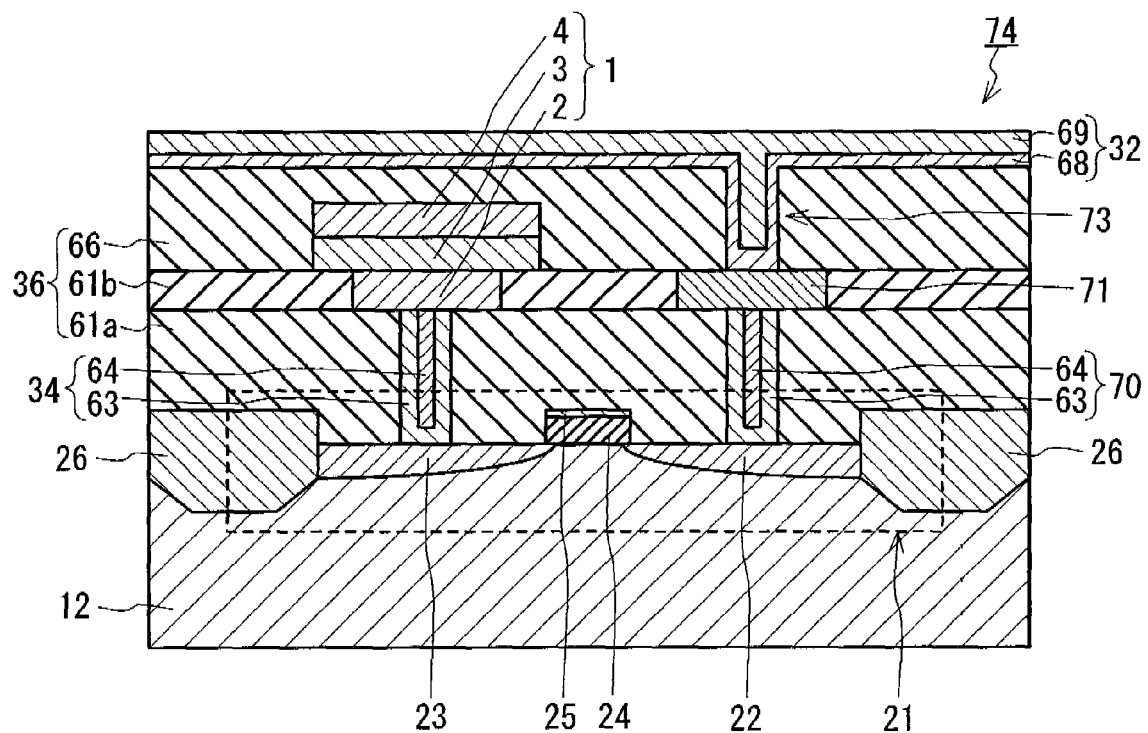

Then, as shown in FIG. 12K, an adhesive metal 68 and a wiring metal 69 are deposited on the surface of the film 66 in this order to form a bit line 32 and a plug 73 electrically connecting the bit line 32 with the electrode 71. The wiring metal 69 may be deposited to fill the opening 72 and to form the bit line 32. In this way, a memory element 74 having a different configuration from that of the memory element 31 shown in FIG. 5 can be formed.

EXAMPLES

Hereinbelow, the present invention is described in further detail with reference to Examples. It should be noted that the present invention is not limited to Examples described below.

Example 1

In Example 1, an electro-resistance element 1 having a configuration shown in FIG. 1 was fabricated and its resistance change characteristics were evaluated. A specific method for fabricating the evaluated sample is shown in FIGS. 13A to 13G.

Figure 13A:
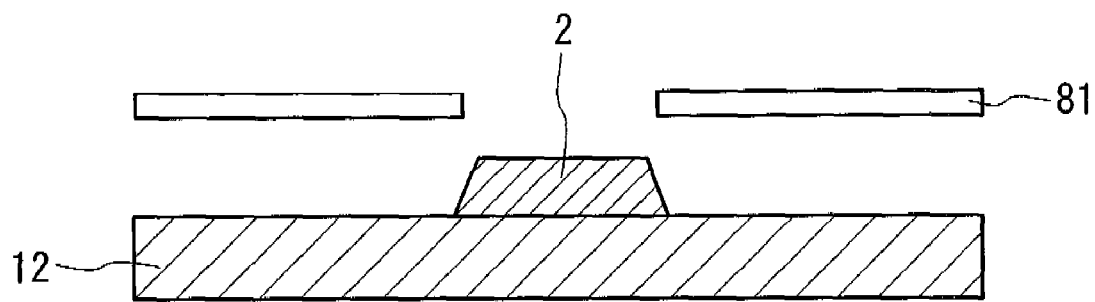
FIGS. 13A to 13G are process drawings schematically illustrating the method of manufacturing the sample of the electro-resistance element according to the present invention fabricated in Examples.

First, a Si substrate with a thermally oxidized film (a $SiO_2$ film: not shown) formed on its surface as a substrate 12 was prepared, and a metal mask A81 having an opening fitting into the shape of a lower electrode 2 to be formed, was disposed on the prepared Si substrate to form an $Fe_3O_4$ film with a thickness of 400 nm as the lower electrode 2 as shown in FIG. 13A. The opening is typically in a rectangular shape having its width overlapping for about three times of junction size of the element (junction area). An example of the opening includes a polygonal part, which is equivalent to wiring for pad drawing and a contact pad section, besides a rectangular part with 7 μm in width by 20 μm in length in the case that the junction area forms an element of 1 μm by 1 μm.

The $Fe_3O_4$ film as the lower electrode 2 was formed by using an iron oxide having a composition represented by the formula $FeO_{0.75}$ as a target and by magnetron sputtering under an argon atmosphere at a pressure of 0.6 Pa, setting a temperature of the Si substrate in the range between room temperature to 400° C. (mainly at 300° C.) and the applied electric power at RF 100 W.

Resistivity of the $Fe_3O_4$ film formed on the Si substrate was evaluated by the four-point probe method, and it was within the range of approximately 5 mΩ·cm to 50 mΩ·cm (typically 10 mΩ·cm). The composition of the film was identified by crystallography by X-ray diffraction, infrared spectroscopy and Raman scattering spectroscopy.

Figure 13B:
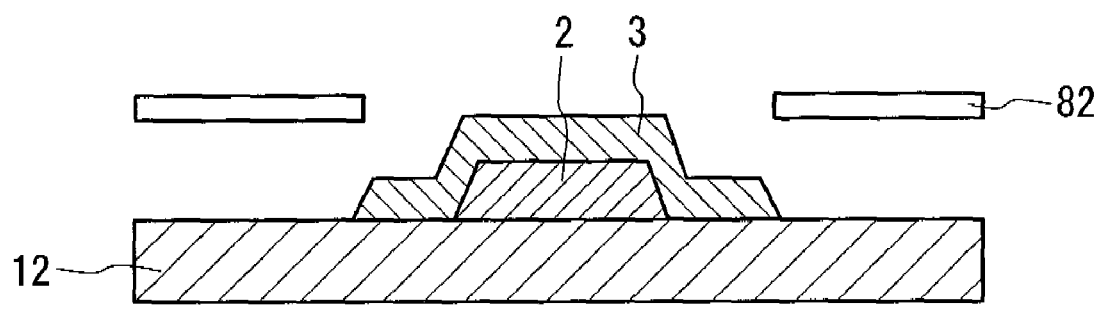

Next, after removing the mask A81, a metal mask B82 having a square opening is disposed to overlay a part of the formed lower electrode 2, and an $Fe_2O_3$ film, with a thickness of 2 nm to 200 nm: typically 20 nm, is formed as an electro-resistance layer 3 on the lower electrode 2 as shown in FIG. 13B. The mask B82 was disposed to match the center of its opening (hereinafter, in a rectangular object, the point of intersection of two linear lines connecting the opposing vertexes is defined as the center of the object) with the center of the lower electrode 2.

The $Fe_2O_3$ film as the layer 3 was formed by using an iron oxide having a composition represented by the formula $FeO_{0.75}$, i.e. the identical iron oxide used on forming the lower electrode 2, as a target and by magnetron sputtering under an argon-oxygen mixture atmosphere (argon:oxygen (partial pressure ratio)=8:1) at a pressure of 0.6 Pa, setting a temperature of the Si substrate in the range between room temperature and 400° C. (mainly at 300° C.) and the applied electric power at RF 100 W.

The composition of the film also was identified by crystallography by X-ray diffraction, infrared spectroscopy and Raman scattering spectroscopy.

Figure 13C:
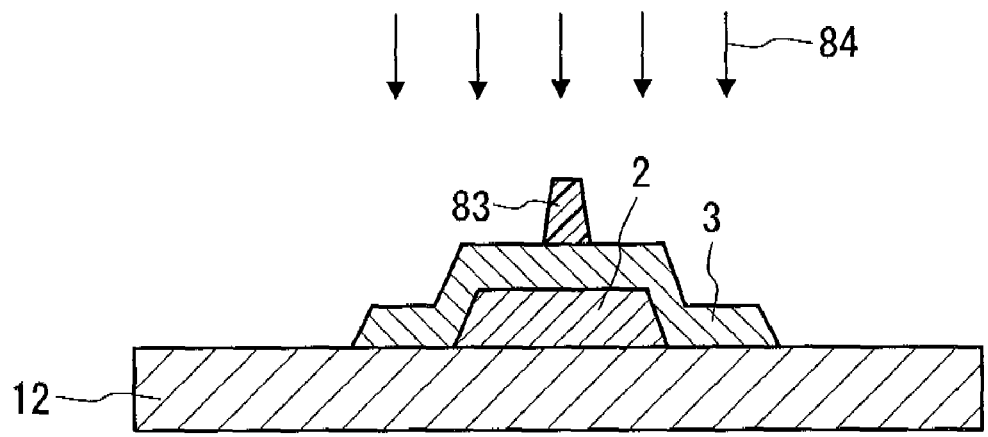
Figure 13D:
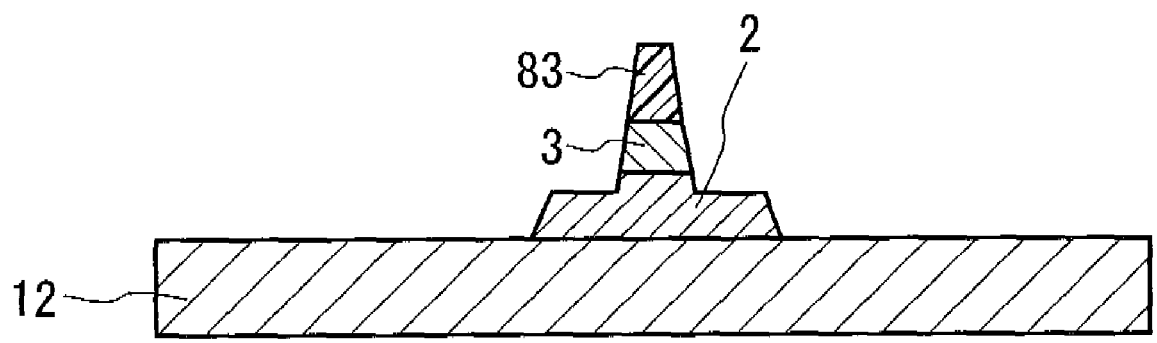

Then, after removing the mask B82, a resist 83 was disposed in the area that was to be an element junction on the surface of the $Fe_2O_3$ film as the layer 3 and the layer 3 was dry etched by ion irradiation 84 as shown in FIG. 13C to microfabricate it in a so-called mesa shape as shown in FIG. 13D. During this process, by adjusting the size of the resist 83, the size of the layer 3, i.e. the size of the element junction (unction area), was varied in the range of 0.1 μm by 0.1 μm to 0.1 mm by 0.1 mm (typically 1 μm by 1 μm). Approximately 10% to 500% (typically about 100%) of the thickness of the layer 3 was over etched upon ion irradiation to secure a stable mesa shape as shown in FIG. 13D. In the case of $Fe_2O_3$ as the layer 3 with a thickness of 2 nm, for example, it was over etched approximately at 10 nm maximum.

Figure 13E:
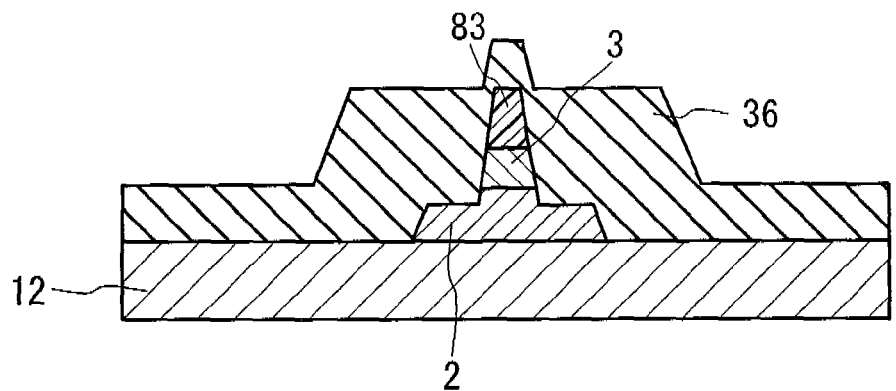
Figure 13F:
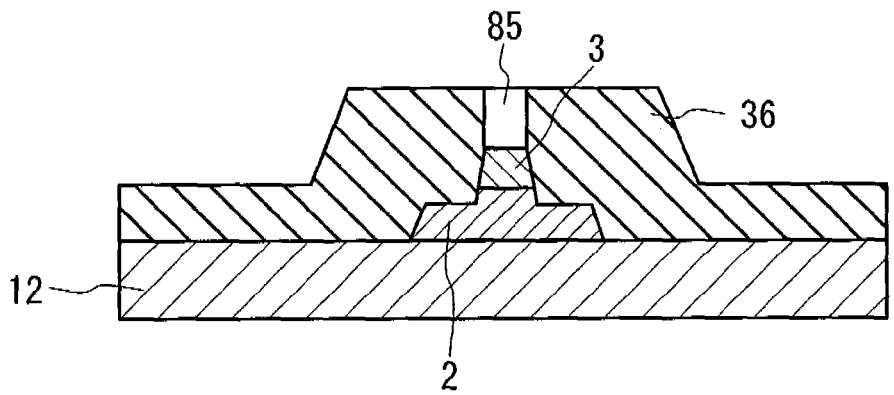

Then, after depositing an interlayer insulating layer 36 on the substrate 12 to overlay all of the lower electrode 2, the layer 3 and the resist 83 as shown in FIG. 13E, the resist 83 remaining on the layer 3 and the interlayer insulating layer 36 on the resist 83 are removed by lift-off to expose the layer 3 by forming an opening 85 as shown in FIG. 13F. The above TEOS film with a thickness of 400 nm was employed for the interlayer insulating layer 36.

Figure 13G:
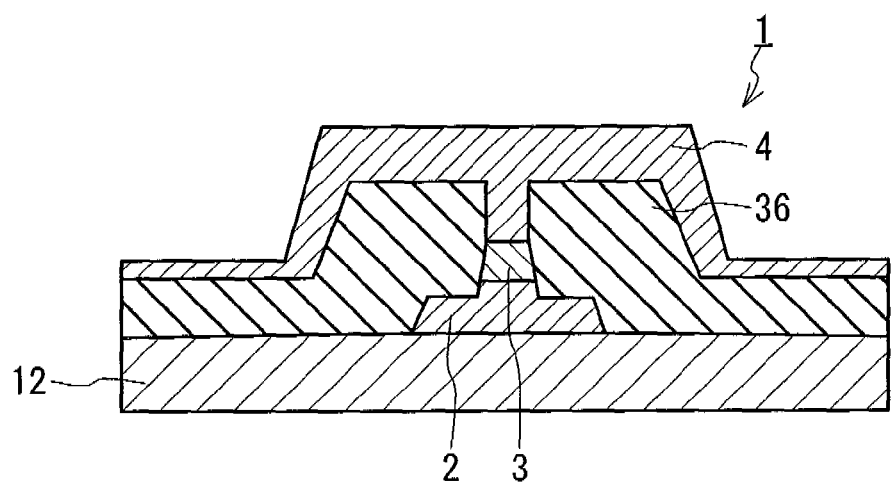

Then, a TiN film with a thickness of 400 nm was formed to overlay the whole, including the surface of the layer 3, as an upper electrode 4 as shown in FIG. 13G. Upon forming the upper electrode 4, the mask A81 was used to have the longitudinal direction of the formed upper electrode 4 and that of the lower electrode 2 orthogonal to each other.

The TiN film as the upper electrode 4 was formed by using Ti as a target and by magnetron sputtering under an nitrogen-argon mixture atmosphere (nitrogen:argon (partial pressure ratio)=approximately 4:1) at a pressure of 0.1 Pa, setting a temperature of the Si substrate in the range between 0° C. and 400° C. (mainly at 300° C.) and the applied electric power at DC 4 kW.

Figure 14:
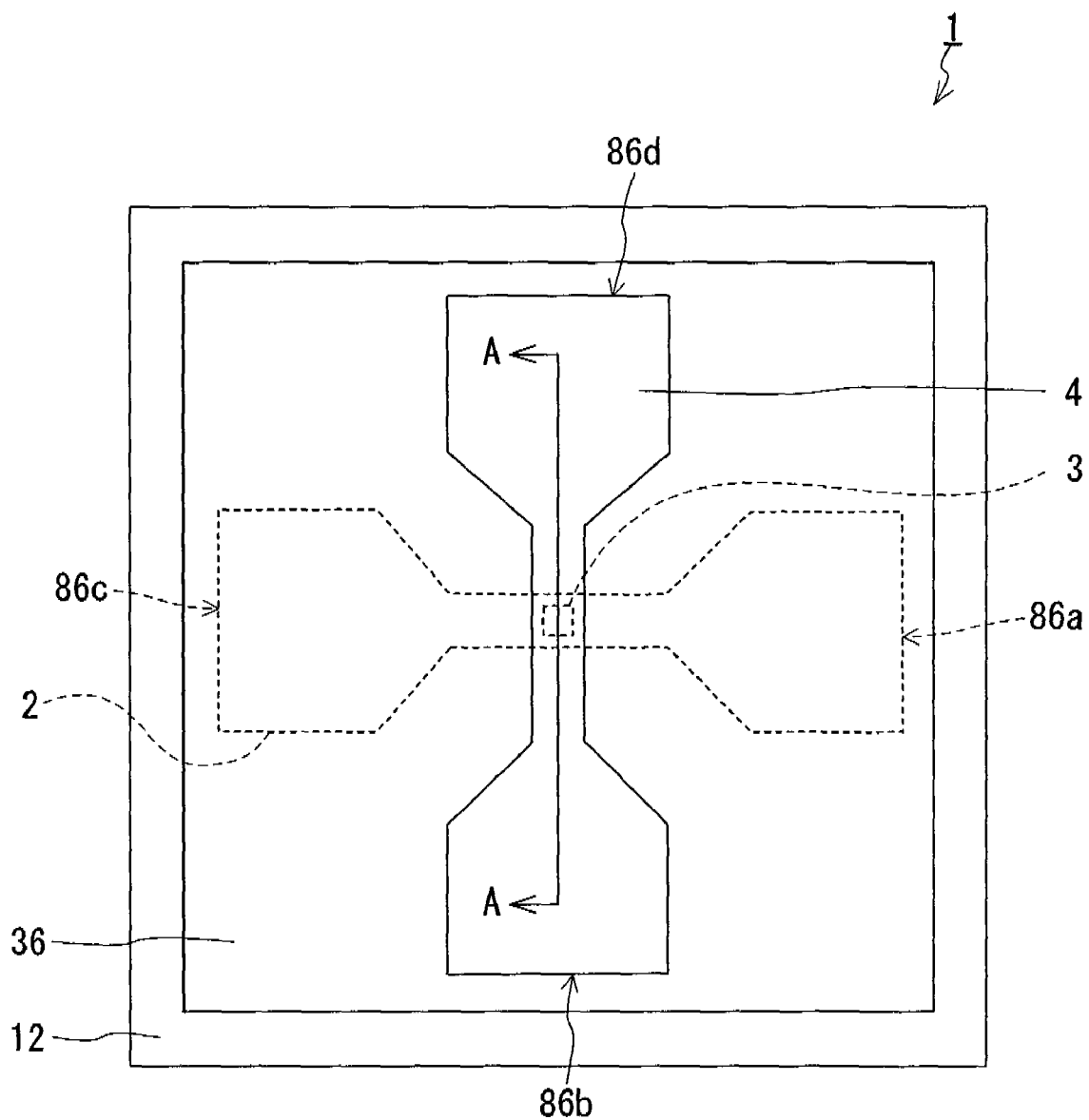
FIG. 14 is a plan view schematically illustrating the sample of the electro-resistance element according to the present invention fabricated in Examples.

An electro-resistance element 1 (sample 1-1) having the configuration shown in FIG. 1 was fabricated in the above manner. FIG. 14 is a plan view of the fabricated element 1 taken in the direction by the upper electrode 4. A cross-section A-A in FIG. 14 corresponds to FIG. 13G.

Figure 15:
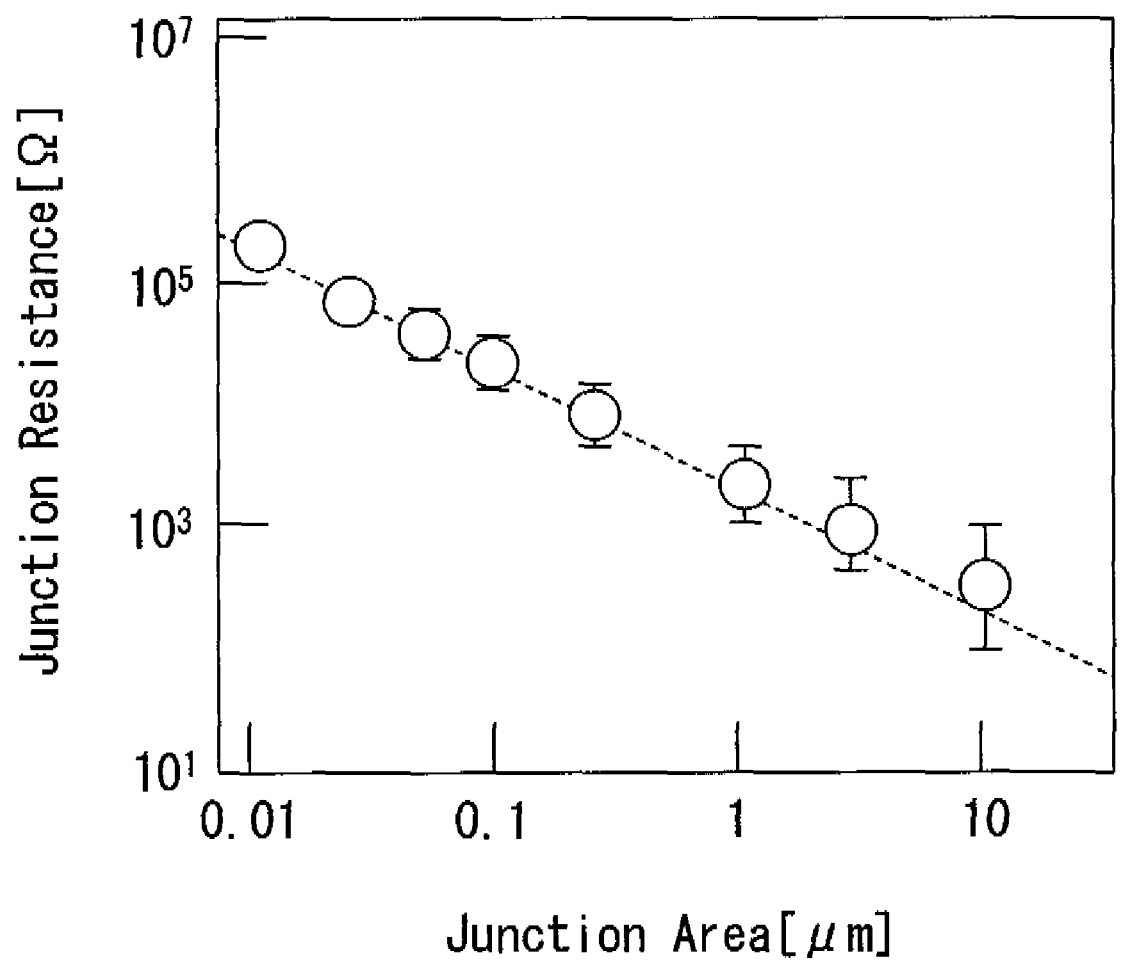
FIG. 15 is a drawing illustrating a relation between junction area and junction resistance in the sample of the electro-resistance element according to the present invention fabricated in Examples.

The initial junction resistance of the sample 1-1 fabricated with the Si substrate at a temperature of 300° C. was evaluated while varying the area of the $Fe_2O_3$ film as the layer 3, i.e. the junction area of the element 1, in the range of 0.1 μm by 0.1 μm (0.01 μm²) to 3.16 μm by 3.16 μm (10 μm²) and the result shown in FIG. 15 was obtained. The junction resistance of the sample 1-1 was evaluated by applying a current to contact pads 86a and 86b, which are parts of the upper electrode 4 and the lower electrode 2 shown in FIG. 14 and measuring the voltage between the contact pads 86c and 86d by four-terminal measurement.

As a result of the evaluation, as shown in FIG. 15, a product RA of an area A of the $Fe_2O_3$ film, which is an junction area of the element 1, and junction resistance R of the element was not dependent on the value of the area A but almost a constant value, which is approximately 5 kΩ·μm². Considering this result, it is thought that the $Fe_2O_3$ film as the layer 3 controls the junction resistance of the element 1, that neither the $Fe_3O_4$ film nor the TiN film scarcely contributes to the junction resistance of the element 1 because the $Fe_3O_4$ film as the lower electrode 2 and the TiN film as the upper electrode 4 only function as electrodes. It was found that the electro-resistance element of the present invention could be manufactured stably regardless of the junction area because the RA value was almost constant even in the case of varying the junction area of the element 1.

Separately from the junction resistance evaluation above, pulsed voltages of SET, RESET and READ were applied to the sample 1-1 fabricated in the above manner, via the lower and upper electrodes as shown in FIG. 6 to evaluate the resistance change ratio. The evaluation method is described in the following.

(Evaluation Method of the Resistance Change Ratio)

Using a pulse generator, a voltage of 3 V (positive bias voltage) as the SET voltage, a voltage of −3 V (negative bias voltage, magnitude 3 V) as the RESET voltage, and a voltage of 0.01 V (positive bias voltage) as the READ voltage were applied between the upper and the lower electrodes of the sample 1-1, where the pulse width of each voltage was 200 ns. After applying the SET voltage or the RESET voltage, the electric resistance values of the sample 1-1 were calculated from the current values read through applying the READ voltage, and the resistance change ratio of the sample 1-1 was obtained by the formula represented as $(R_{MAX}-R_{MIN})/R_{MIN}$, where $R_{MAX}$ is the maximum value of the calculated electric resistance values and $R_{MIN}$ is the minimum value thereof. The evaluation method of the resistance change ratio for the element sample is the same in each sample below.

As a result of the evaluation, the resistance change ratio of the sample 1-1 was approximately within the range of a ten fold change to a 100 fold change regardless of its junction area, and was typically about a 50 fold change.

In the case where a plurality of the samples 1-1 were formed in the identical Si substrate (a Si wafer) to evaluate the resistance change ratio of the samples formed in the same manner as above, their dispersion in the wafer was as small as several percentage or less.

Separately from fabricating the sample 1-1, elements (samples 1-2 to 1-13: junction area of 1 μm by 1 μm), which were provided with upper electrodes having the composition shown in the Table 1 below, were fabricated to be evaluated the resistant change ratio of each sample in the same manner as above. The evaluation results including the result of the sample 1-1 are shown in the Table 1 below. In the sample 1-2, in which the upper electrode was made of $Fe_3O_4$, the upper electrode was formed using the iron oxide used for forming the lower electrode and the electro-resistance layer as a target under the same atmosphere as that on forming the lower electrode.

TABLE 1

| Sample No. | Lower Electrode 2 | Electro-resistance Layer 3 | Upper Electrode 4 | Resistance Change Ratio (fold) |
|---|---|---|---|---|
| 1-1 | $Fe_3O_4$ | $Fe_2O_3$ | TiN | 10 to 100 |
| 1-2 | | | $Fe_3O_4$ | 25 |
| 1-3 | | | Ti | 10 |
| 1-4 | | | Al | 10 |
| 1-5 | | | Cu | 15 |
| 1-6 | | | Ta | 10 |
| 1-7 | | | $Ir_{0.7}Ta_{0.3}$ | 10 |
| 1-8 | | | ITO*[1] | 10 |
| 1-9 | | | Ni | 15 |
| 1-10 | | | Co | 15 |
| 1-11 | | | Fe | 15 |
| 1-12 | | | $Ti_{0.65}Al_{0.35}$ | 10 |
| 1-13 | | | $Ti_{0.65}Al_{0.35}N$ | 20 |

*[1]ITO: Indium Tin Oxide

As shown in Table 1, a ten fold or more change in the resistance change ratio was obtained in each sample.

Separately from fabricating each sample above, comparative samples A1 and A2 junction area of 1 μm by 1 μm) having $Fe_3O_4$ film as their electro-resistance layers were fabricated using the same manufacturing processes as the sample 1-1.

For the comparative samples A1 and A2, a Pt film with a thickness of 400 nm and a TiN film with a thickness of 400 nm were employed as each lower electrode respectively, and a Pt film with a thickness of 400 nm and an Au film with a thickness of 400 nm were employed as each upper electrode respectively.

The $Fe_3O_4$ film as the electro-resistance layer was formed by using an iron oxide having a composition represented by the formula $FeO_{0.75}$ as a target and by magnetron sputtering under an argon atmosphere at a pressure of 0.6 Pa, setting a temperature of the Si substrate in the range between room temperature and 400° C. (mainly at 300° C.) and the applied electric power at RF 100 W. The resistivity of a single-layer $Fe_3O_4$ film formed under the same condition was measured as approximately 10 mΩ·cm.

The Au film was formed by vacuum evaporation at the room temperature. The Pt film was formed by magnetron sputtering under an argon atmosphere at a pressure of 0.7 Pa, setting a temperature of the Si substrate at 27° C. and the applied electric power at 100 W. The TiN film was formed by using Ti as a target and by magnetron sputtering under a nitrogen-argon mixture atmosphere (nitrogen:argon (partial pressure ratio)=approximately 4:1) at a pressure of 0.1 Pa, setting a temperature of the Si substrate in the range between 0° C. and 400° C. (mainly at 350° C.) and the applied electric power at DC 4 kW.

The resistance change ratio of the comparative samples A1 and A2 formed in the above manner was evaluated. The results of evaluation are shown in Table 2 below.

TABLE 2

| Sample No. | Lower Electrode 2 | Electro-resistance Layer 3 | Upper Electrode 4 | Resistance Change Ratio (fold) |
|---|---|---|---|---|
| A1 (Comparative Example) | Pt | $Fe_3O_4$ | Pt | 0.1 or less |
| A2 (Comparative Example) | TiN | | Au | 2 |

As shown in Table 2, the resistance change ratio of the elements was not as large as that of the samples 1-1 to 1-13 in the comparative samples A1 and A2, which used $Fe_3O_4$ films as their electro-resistance layers, and in particular the resistance change ratio was hardly detected in the comparative sample A1. On evaluating the resistance change ratio of both of the comparative samples, the voltage actually applied to the elements and the current actually owing in the elements were measured, and it was found that the voltage was less than 3 V and that the current at approximately several mA was flowing in the elements. The facts that the resistivity of the $Fe_3O_4$ film as the electro-resistance layer is low and that the impedance of the elements is low are considered as the causes.

Example 2

In Example 2, a memory element 31 having the configuration shown in FIG. 5 was fabricated and the resistance change characteristics were evaluated. The evaluated samples were fabricated by the processes shown in FIGS. 11A to 11H above and their electro-resistance layers 3 were made of $Fe_2O_3$ film.

A TEOS film with a thickness of 400 nm was employed as a protective insulation film 61. A stacked structure of a Ti film and a TiN film was employed as a barrier metal 63. A tungsten film was employed as a plug metal 64.

An $Fe_3O_4$ film with a thickness of 200 nm was employed as a lower electrode 2, and the film was formed by using an iron oxide having a composition represented by the formula $FeO_{0.75}$ as a target and by magnetron sputtering under an argon atmosphere at a pressure of 0.6 Pa, setting a temperature of the Si substrate in the range between room temperature and 400° C. (mainly at 300° C.) and the applied electric power at RF 100 W.

An $Fe_2O_3$ film with a thickness of 50 nm was employed as an electro-resistance layer 3, and the film was formed by using an iron oxide having a composition represented by the formula $FeO_{1.5}$ as a target and by magnetron sputtering under an argon atmosphere at a pressure of 0.6 Pa, setting a temperature of the Si substrate in the range between room temperature and 400° C. (mainly at 300° C.) and the applied electric power at RF 100 W.

A TiAlN film with a thickness of 400 nm was employed as an upper electrode 4, and the film was formed by using a $Ti_{0.6}Al_{0.4}$ alloy as a target and by magnetron sputtering under a nitrogen-argon mixture atmosphere (nitrogen:argon (partial pressure ratio)=approximately 4:1) at a pressure of 0.1 Pa, setting a temperature of the Si substrate in the range between 0° C. and 400° C. (mainly at 350° C.) and the applied electric power at DC 4 kW.

A TEOS film with a thickness of 800 nm was employed as a protective insulation film 66. A TaN film with a thickness of 10 nm was employed as an adhesive metal 68, and a Cu film with a thickness of 300 nm was employed as a wiring metal 69. The wiring metal 69 was deposited to configure bit lines 32 in FIG. 11H.

The memory element 31 (sample 2-1) having the configuration shown in FIG. 5 was fabricated in the above manner. The junction area of the sample 2-1 was 0.9 µm by 0.6 µm.

The initial junction resistance of the sample 2-1 was evaluated in the same manner as that of the sample 1-1, and the result was approximately 1 kΩ.

Pulsed voltages of SET, RESET and READ were applied as shown in FIG. 6 to the sample 2-1 fabricated in the above manner in order to confirm its operation as a memory element and to evaluate the resistance change ratio.

The operation was confirmed by measuring the current values output by the sample 2-1 on applying a voltage of 2 V (positive bias voltage) as the SET voltage, a voltage of −2 V (negative bias voltage, magnitude 2 V) as the RESET voltage, and a voltage of 0.05 V (positive bias voltage) as the READ voltage between a source 22 and the upper electrode 4 after turning ON a transistor 21 by applying a voltage to a gate 25. The pulse width of each voltage applied to the sample 2-1 was 200 ns. The current values were measured by detecting difference values from reference current values obtained by applying voltages having the same condition as the READ voltage applied to the sample 2-1 to a reference resistor disposed separately from the sample 2-1.

As the results of the operation confirmation, a ten fold or more change (a ten fold change to a 100 fold change) in the resistance change ratio was obtained and the capability of the sample 2-1 to be operated stably as a memory element was confirmed. It was found that a memory element with excellent endurance characteristics was formed because its resistance change characteristics, i.e. memory characteristics, were retained even upon applying the SET and RESET voltages at $10^6$ times or more.

Next, a 16-bit memory array was constructed by aligning 16 of the samples 2-1 in a four by four matrix to confirm the operation of the memory array in the same manner as that of the sample 2-1 as a memory element, and its operation as a random access electro-resistance memory was confirmed.

Separately from fabricating the sample 2-1, comparative samples B1 and B2 (junction area of 0.9 µm by 0.6 µm) with the lower electrode 2 made by a Pt film or a TiN film and the electro-resistance layer 3 made of an $Fe_2O_3$ film were fabricated using the same manufacturing processes as those of the sample 2-1.

For the comparative samples B1 and B2, a Pt film with a thickness of 200 nm and a TiN film with a thickness of 200 nm were employed as each lower electrode respectively, and a TiAlN film with a thickness of 400 nm was employed as each upper electrode.

An $Fe_2O_3$ film as the electro-resistance layer was formed in the same manner as that of the sample 2-1.

The Pt film was formed by magnetron sputtering under an argon atmosphere at a pressure of 0.7 Pa, setting a temperature of the Si substrate at 27° C. and the applied electric power at 100 W. The TiN film was formed by using Ti as a target and by magnetron sputtering under a nitrogen-argon mixture atmosphere (nitrogen:argon (partial pressure ratio)=approximately 4:1) at a pressure of 0.1 Pa, setting a temperature of the Si substrate in the range between 0° C. and 400° C. (mainly at 350° C.) and the applied electric power at DC 4 kW. The TiAlN film was formed in the same manner as that of the sample 2-1.

The other films and layers were formed in the same manner as those of the sample 2-1.

To the comparative samples B1 and B2 fabricated in the above manner, operation confirmation as memory elements was performed and their resistance change ratio was evaluated in the same manner as to the sample 2-1.

As a result of the evaluation, the initial conjunction resistance of the comparative samples B1 and B2 were similar to the sample 2-1, while they showed the resistance change ratio even smaller than that of the sample 2-1. The resistance change ratio was only two fold at maximum (sample B2). A decrease in the resistance change ratio in the comparative samples B1 and B2 was observed by repeatedly applying the SET and RESET voltages, and their resistance change characteristics were lost by repeatedly applying at approximately $10^2$ times.

Since the sample 2-1 has the identical electro-resistance layer as that of the comparative samples B1 and B2, it is considered that the difference in their lower electrodes highly affects in the resistance change characteristics as an electro-resistance element (a memory element).

Separately from fabricating the samples above, a memory element sample (sample 2-2) having the same configuration as the sample 2-1, except for employing an $Fe_3O_4$ film instead of the TiAlN film as the upper electrode, was fabricated. The $Fe_3O_4$ film as the upper electrode was formed in the same manner as the lower electrode of the sample 2-1.

For the sample 2-2 fabricated in the above manner, operation confirmation as memory elements was performed and its resistance change ratio was evaluated in the same manner as the sample 2-1.

As the results, with the sample 2-2, a ten fold change or more (a ten fold change to a 100 fold change) in the resistance change ratio was obtained similar to the sample 2-1 and it was found that that a memory element with excellent endurance characteristics was formed because its resistance change characteristics were remained even by applying the SET and RESET voltages at $10^6$ times or more.

The results of evaluating the samples 2-1 and 2-2 and the comparative samples B1 and B2 are shown in Table 3 below.

TABLE 3

| Sample No. | Lower Electrode 2 | Electro-resistance Layer 3 | Upper Electrode 4 | Resistance Change Ratio (fold) | Endurance Characteristics |
|---|---|---|---|---|---|
| 2-1 | $Fe_3O_4$ | $Fe_2O_3$ | TiAlN | 10 to 100 | $10^6$ or more |
| 2-2 | | | $Fe_3O_4$ | 10 to 100 | $10^6$ or more |
| B1 (Comparative Example) | Pt | | TiAlN | 1 | $10^2$ or less |
| B2 (Comparative Example) | TiN | | | 2 | $10^2$ or less |

Example 3

In Example 3, a memory element 74 having the configuration shown in FIG. 12K was fabricated and the resistance change characteristics were evaluated. The evaluated samples were fabricated by the processes shown in FIGS. 12A to 12K and their electro-resistance layers 3 were made of $Fe_2O_3$ film.

A TEOS film with a thickness of 400 nm was employed as a protective insulation film 61a. A stacked structure of a Ti film and a TiN film was employed as a barrier metal 63. A tungsten film was employed as a plug metal 64.

An $Fe_3O_4$ film with a thickness of 100 nm was employed as a lower electrode 2, and the film was formed by using an iron oxide having a composition represented by the formula $FeO_{0.75}$ as a target and by magnetron sputtering under an argon atmosphere at a pressure of 0.6 Pa, setting a temperature of the Si substrate in the range between room temperature and 400° C. (mainly at 300° C.) and the applied electric power at RF 100 W.

A TEOS film was employed as a protective insulation film 61b.

An $Fe_2O_3$ film with a thickness of 2 nm to 200 nm, typically 100 nm, was employed as an electro-resistance layer 3, and the film was formed by using an iron oxide having a composition represented by the formula $FeO_{1.5}$ as a target and by magnetron sputtering under an argon atmosphere at a pressure of 0.6 Pa, setting a temperature of the Si substrate in the range between room temperature and 400° C. (mainly at 300° C.) and the applied electric power at RF 100 W.

A TiAlN film with a thickness of 200 nm was employed as an upper electrode 4, and the film was formed by using a $Ti_{0.6}Al_{0.4}$ alloy as a target and by magnetron sputtering under a nitrogen-argon mixture atmosphere (nitrogen:argon (partial pressure ratio)=approximately 4:1) at a pressure of 0.1 Pa, setting a temperature of the Si substrate in the range between 0° C. and 400° C. (mainly at 350° C.) and the applied electric power at DC 4 kW.

A TEOS film with a thickness of 800 nm was employed as a protective insulation film 66. A TaN film with a thickness of 20 nm was employed as an adhesive metal 68, and a Cu film with a thickness of 300 nm was employed as a wiring metal 69. The wiring metal 69 was deposited to configure bit lines 32 shown in FIG. 12K.

The memory element 40 (sample 3) having the configuration shown in FIG. 12K was fabricated in the above manner. The junction area of the sample 3 was 0.9 μm by 0.6 μm.

Pulsed voltages of SET, RESET and READ were applied as shown in FIG. 6 to the sample 3 fabricated in the above manner in order to confirm its operation as a memory element and to evaluate its resistance change ratio.

The operation was confirmed by measuring the current values output from the sample 3 on applying a voltage of 2 V (positive bias voltage) as the SET voltage, a voltage of −2 V (negative bias voltage, magnitude 2 V) as the RESET voltage, and a voltage of 0.05 V (positive bias voltage) as the READ voltage between a source 22 and the upper electrode 4 after turning ON a transistor 21 by applying a voltage to a gate 25. The pulse width of each voltage applied to the sample 3 was 200 ns. The current values were measured by detecting difference values from reference current values obtained by applying voltages having the same condition as the READ voltage applied to the sample 3 to a reference resistor disposed separately from the sample 3.

As the results, an approximately 50 fold change in the resistance change ratio was obtained and the capability of the sample 3 to be operated stably as a memory element was confirmed. It was found that a memory element with excellent endurance characteristics was formed because its resistance change characteristics were retained even upon applying the SET and RESET voltages at $10^6$ times or more. The result of evaluating the sample 3 is shown in Table 4 below.

TABLE 4

| Sample No. | Lower Electrode 2 | Electro-resistance Layer 3 | Upper Electrode 4 | Resistance Change Ratio (fold) | Endurance Characteristics |
|---|---|---|---|---|---|
| 3 | $Fe_3O_4$ | $Fe_2O_3$ | TiAlN | 50 | $10^6$ or more |

Next, the shapes (driving waveforms) of the voltages of SET, RESET and READ are changed from rectangular waveforms, as shown in FIG. 6, into trapezoidal waveforms with a slope of about 10 ns in each rising and falling edge of the pulse (without changing the pulse width), and the operation confirmation was performed. It was also confirmed to be capable of being operated stably as a memory element similar to the case in which their shapes were rectangular. The same was found for the case when the driving waveform was changed to a sine waveform (without changing the pulse width). It was found that the oscillating ringing noise, which used to arise at the rising and falling of the output signals of the element, was successfully reduced on applying the pulsed voltage to the element by changing the driving waveform into the trapezoidal or sine waveforms.

Next, a 16-bit memory array was constructed by aligning 16 of the samples 3 in a four by four matrix to confirm the operation of the memory array in the same manner as that of the sample 3 as a memory element, and its operation as a random access electro-resistance memory was confirmed.

Example 4

Figure 16:
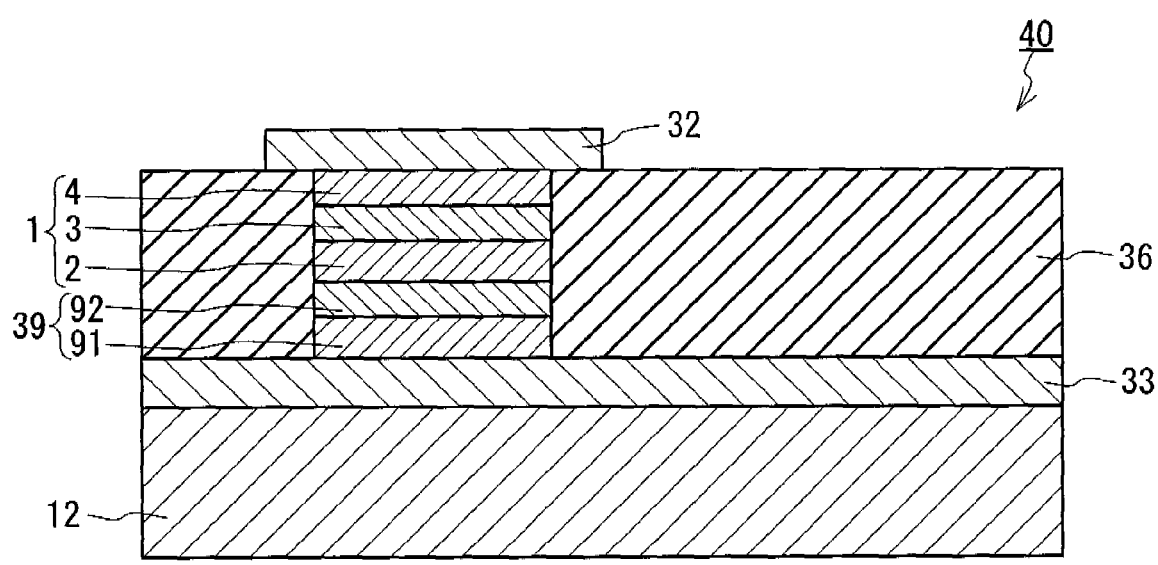
FIG. 16 is a cross-sectional view schematically illustrating the memory element provided with the selective element according to the present invention fabricated in Examples.

In Example 4, a memory element 40 having the configuration shown in FIG. 16 was fabricated and a memory array 53 having the configuration shown in FIG. 10 is formed by aligning a plurality of the fabricated memory elements 40 in a matrix to confirm the operation of the memory array.

The memory element 40 shown in FIG. 16 has a Schottky junction having I-V characteristics similar to that of a diode as a selective element 39, and has a configuration where the selective element 39 and an electro-resistance element 1 are connected electrically in series between a word line 33 and a bit line 32. The memory array 53 having the configuration shown in FIG. 10 is constructed by aligning a plurality of the memory elements 40 in a matrix. The method of fabricating the evaluated memory array sample was shown below.

On a substrate 12, which has four Cu wirings disposed in parallel to each other on its surface as the word line 33, a ZnO film with a thickness of 300 nm as an n-type semiconductor layer 91, a ZnAlO/TiN stacked film with a thickness of 300 nm for ZnAlO and that of 50 nm for TiN as a conductive layer 92, an $Fe_3O_4$ film with a thickness of 50 nm as a lower electrode 2, an $Fe_2O_3$ film with a thickness of 50 nm as an electro-resistance layer 3 and a TiAN film with a thickness of 200 nm as an upper electrode 4 were formed in this order. The ZnO film as the n-type semiconductor layer 91 was formed to secure an electrical connection to the Cu wirings as the word line 33.

A junction of the ZnO film as the n-type semiconductor layer 91 and the ZnAlO/TiN film as the conductive layer 92 operates as a diode having Schottky-like rectification by joining both of the layers.

The ZnO film was formed by using ZnO as a target and by magnetron sputtering under an argon-oxygen mixture atmosphere (argon:oxygen (partial pressure ratio)=4:1) at a pressure of 0.6 Pa, setting a temperature of the Si substrate in the range between room temperature and 500° C. (mainly at 350° C.) and the applied electric power at RF 50 W to 400 W (typically at RF 200 W). The ZnAlO film was formed by using $Zn_{0.98}Al_{0.02}O$ as a target and by magnetron sputtering under an argon-oxygen mixture atmosphere (argon:oxygen (partial pressure ratio)=4:1) at a pressure of 0.6 Pa, setting a temperature of the Si substrate in the range between room temperature and 500° C. (mainly at 350° C.) and the applied electric power at RF 50 W to 400 W (typically at RF 200 W).

The $Fe_3O_4$, $Fe_2O_3$ and TiAN films were formed in the same manner as the sample 2-1.

Next, each film formed on the substrate 12 was microfabricated to align stacked structures (the memory elements 40) of each film in a four by four matrix in the substrate 12 as a whole by providing four of them per a Cu wiring. The junction area of each memory element 40 was in the range of 0.01 µm² to 1 µm² (typically 0.3 µm²).

Then, after forming an interlayer insulating layer 36 made of a TEOS film, the bit line 32 made of Cu was formed to secure an electrical connection with the TiAlN film as the upper electrode 4, and thus a memory array sample (sample 4) was made.

Figure 17:
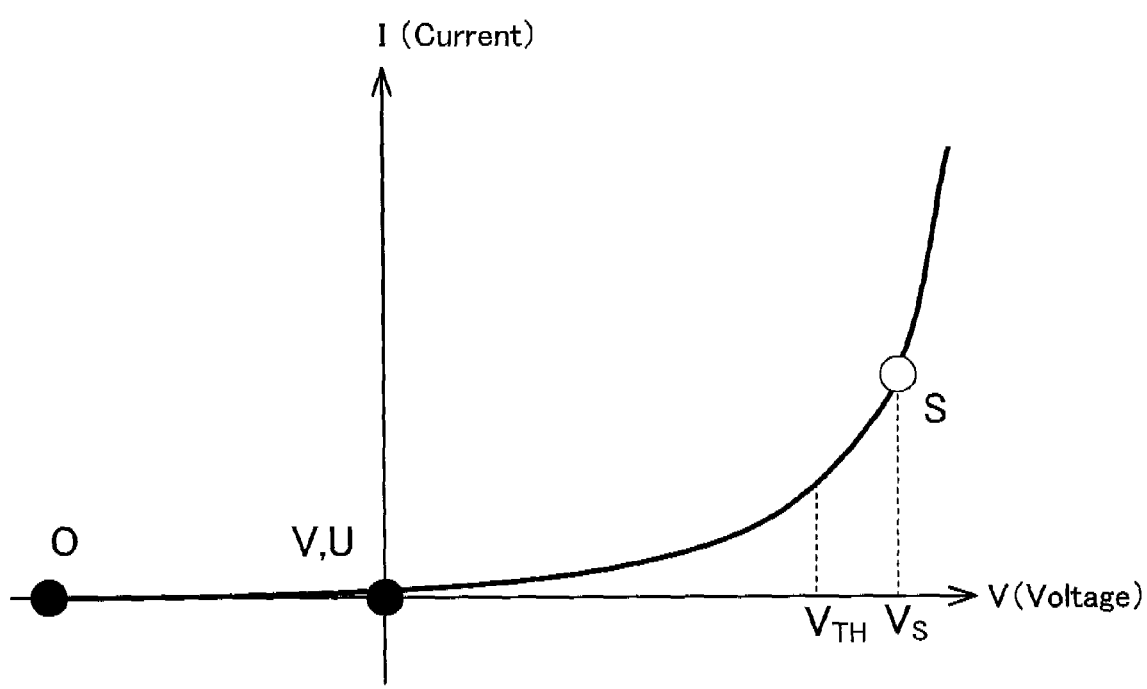
FIG. 17 is a drawing illustrating current-voltage characteristics (I-V characteristics) of the selective element with which the memory element according to the present invention fabricated in Examples is provided.

The result shown in FIG. 17 was obtained by evaluating the I-V characteristics of the selective element 39 of the sample 4 fabricated in the above manner. As shown in FIG. 17, it was found that the selective element 39 had rectification as a diode when the voltage applied to the element was in the range of $V_{TH}$ or lower and showed nonlinear I-V characteristics when the voltage exceeds $V_{TH}$. $V_{TH}$ was approximately 0.5 V.

Figure 18:
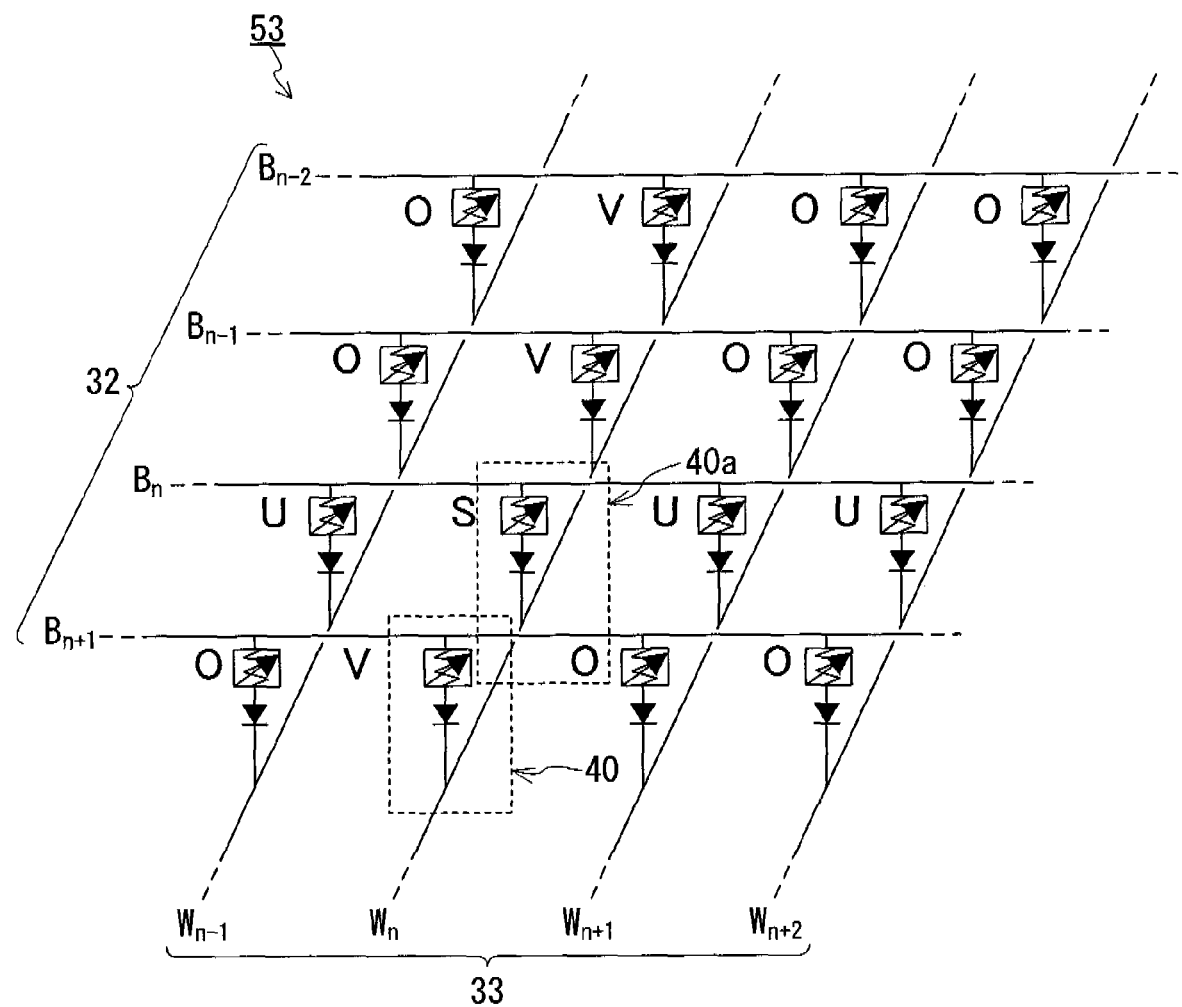
FIG. 18 is a schematic view illustrating the electro-resistance memory array provided with the electro-resistance element according to the present invention fabricated in Examples.

Then, a memory element 40a was selected among the memory elements 40 configuring the sample 4 and a bias voltage $V_S$ was applied to it by making the voltage of a bit line $B_n$ connected to the memory element 40a High-level (H-level: +3.3 V) and making that of a word line $W_n$ connected to the element 40a Low-level (L-level: ±0V), as shown in FIG. 18. The bias voltage $V_S$ applied to the element 40a is the voltage at S point in FIG. 17, which has a greater value than the voltage $V_{TH}$. The selective element 39 showed nonlinear I-V characteristics by applying the bias voltage $V_S$. A MOS-FET (not shown), which is a switching element disposed on the vicinity of the sample 4-1, was used for applying the bias voltage $V_S$.

As shown in FIG. 18, in the unselected memory elements 40, the applied voltage was at a breakdown voltage of the selective element 39 or lower, which was either in the range that the rectification was secured (at O point shown in FIG. 17), or in the range that the bias voltage was almost "0" (at V or U point shown in FIG. 17). Thus, it was possible to read the current value of the selected memory element 40a while eliminating the influence of wraparound from coordinates other than the coordinate ($B_n$, $W_n$) of the memory element 40a. It is considered that relative comparison between the current value and a current value of the reference element enables judgment whether the information retained by the memory element 40a is "1" or "0". In FIG. 18, each state of the selective element of each memory element upon applying the bias voltage $V_S$ to the memory element 40a is represented by "O", "U" or "V", corresponding to those in FIG. 17.

When the voltage of the word line $W_n$ connected to the memory element 40a was at the grounding voltage (GND), the same result was obtained as well.

Figure 19:
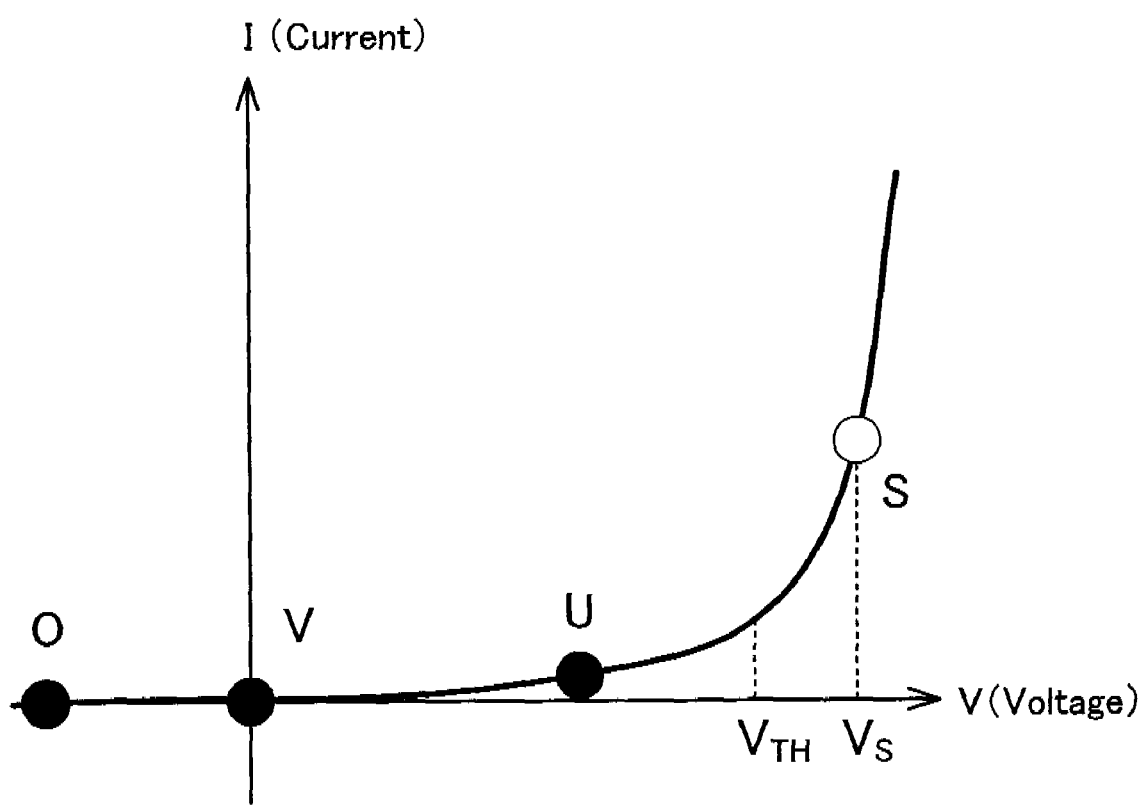
FIG. 19 is a drawing illustrating current-voltage characteristics (I-V characteristics) of the selective element with which the memory element according to the present invention fabricated in Examples is provided.

Considering the I-V characteristics of the selective element 39 shown in FIG. 17, it seems possible to control the bias voltage of three values shown in FIG. 19, with the sample 4-1. Thus, it is possible to set the range of the operation voltage for the memory elements 40 lower upon comparing to the case of controlling the bias voltage of the two values shown in FIGS. 17 and 18, and even more efficient reading is considered to be achieved.

For example, Middle-level voltage, which is in between the High-level and the Low-level, may be defined in order to control the bias voltage of the three values. In the case the Middle-level voltage is defined, it enables a reduction in power consumption for the unselected memory elements 40.

Example 5

In Example 5, an electro-resistance element 1 (sample 5) having an electro-resistance layer 3 made of $Fe_2O_3$ and $Fe_3O_4$ is fabricated to evaluate its resistance change characteristics.

The layer 3 in the sample 5 was formed by using an iron oxide obtained by combining an iron oxide having the composition represented by the formula $FeO_{0.75}$ with an iron oxide having the composition represented by the formula $FeO_{1.5}$ at a desired proportion as a target and by magnetron sputtering under an argon atmosphere at a pressure of 0.6 Pa, setting a temperature of the substrate at 300° C. and the applied electric power at RF 100 W. The sample 5 was formed in the same manner as the sample 1-1 except for forming the layer 3 made of $Fe_2O_3$ and $Fe_3O_4$, and the junction area of the element was 1 µm by 1 µm. In the above condition of film forming, an $Fe_3O_4$ film is formed in the case the iron oxide represented by the formula $FeO_{0.75}$ was used as a target and an $Fe_2O_3$ film in the case of the formula $FeO_{1.5}$. Nine samples with each ratio (β/α) of a content β of $Fe_3O_4$ in percent by weight to a content α of $Fe_2O_3$ in percent by weight in the layer 3 varied in the range of 0% to 30% (each having the ratio of 0%, 4%, 8%, 10%, 15%, 20%, 22%, 25% and 30%) were fabricated by varying the mixing ratio of the two iron oxides when forming the layer 3 in Example 5.

The resistance change ratio of each element sample fabricated as above was evaluated in the same manner to the Example 1. The initial junction resistance of each sample, separately from the evaluation of the resistance change ratio, also was evaluated in the same manner to the Example 1. Results of these evaluations are shown in FIG. 20.

Figure 20:
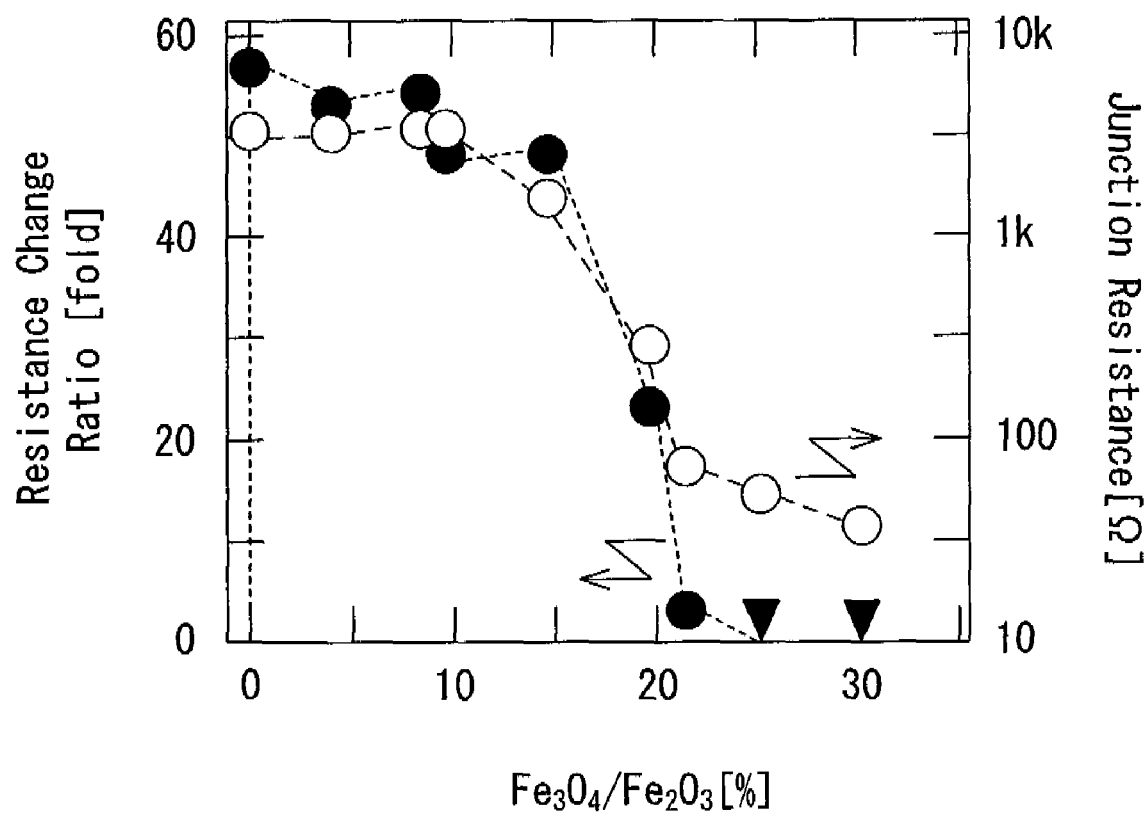
FIG. 20 is a drawing illustrating a relationship between composition of the electro-resistance layer and resistance change ratio in the electro-resistance element according to the present invention fabricated in Examples.

As shown in FIG. 20, a 20 fold or more change in the resistance change ratio was obtained within the range of 0% to 20% of the ratio (β/α) in the electro-resistance layer, while the ratio became twice or lower when the ratio (β/α) exceeds 20%. A higher resistance change ratio was obtained at the ratio (β/α) of 15% or lower and a much higher resistance change ratio at that of 10% or less.

In FIG. 20, the variation of the resistance change ratio of each sample to that of the ratio (β/α) seems to correlate strongly with the variation of initial junction resistance of each sample to that of the ratio (β/α), at first sight. It is apparently not true, however, that an excellent resistance change ratio is obtained simply by increasing the junction resistance of the element from the results of the comparative samples in Example 1 and 2. Since not only bulk resistance but also interface resistance are present in the junction resistance of the element, it is considered that the junction resistance is sensitive to changes in the junction state of the interface between the lower electrode and the electro-resistance layer. This leads to a consideration that the junction interface between the lower electrode and the electro-resistance layer retains a satisfactory junction state as a high resistance change ratio can be obtained when the electro-resistance layer includes $Fe_3O_4$ of 20% or lower in the ratio (β/α), while the state of the junction interface may become insufficient to show such resistance change ratio when the ratio (β/α) exceeds 20%.

Example 6

In Example 6, an electro-resistance layer 3 made of $Fe_2O_3$ was formed on a surface of a lower electrode 2 made of $Fe_3O_4$ film by oxidizing its surface to fabricate an electro-resistance element 1.

Figure 21A:
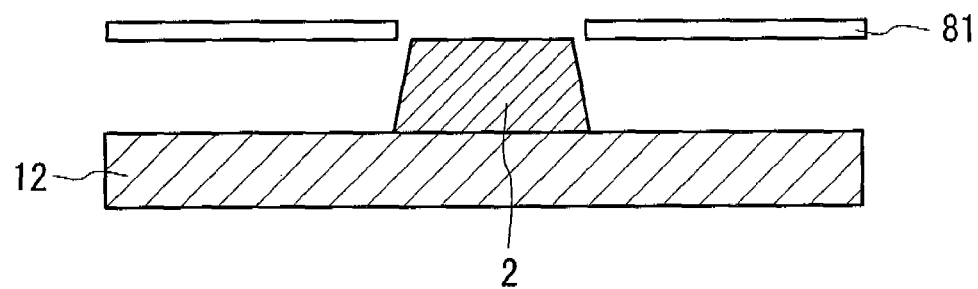
FIGS. 21A to 21F are process drawings schematically illustrating the method of manufacturing the sample of the electro-resistance element according to the present invention fabricated in Examples.
Figure 21B:
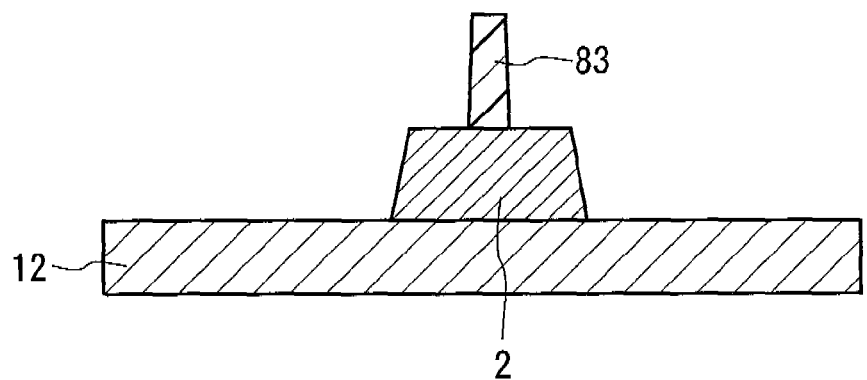

First, similar to Example 1, a lower electrode 2 made of a $Fe_3O_4$ film with a thickness of 500 nm was formed on a Si substrate as a substrate 12 using a metal mask A81 (see FIG. 21A).

Figure 21C:
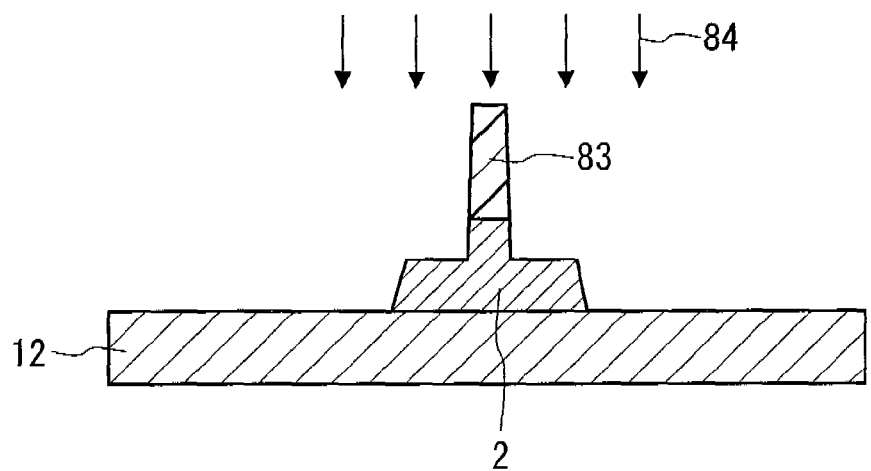

Next, after removing the mask A81, a resist 83 is disposed on the area in which the electro-resistance layer 3 to be formed on the surface of the $Fe_3O_4$ film as the lower electrode 2 (see FIG. 2113) and the lower electrode 2 was microfabricated in a so-called mesa shape by ion irradiation 84 for dry etching (see FIG. 21C). The height of the mesa of the lower electrode 2 was approximately 100 nm and the area of that (the cross-sectional area parallel to the surface of the Si substrate) was 0.1 μm by 0.1 μm to 0.1 mm by 0.1 mm (typically 1 μm by 1 μm). The area became the junction area of the element 1 when the electro-resistance element 1 was fabricated.

Figure 21D:
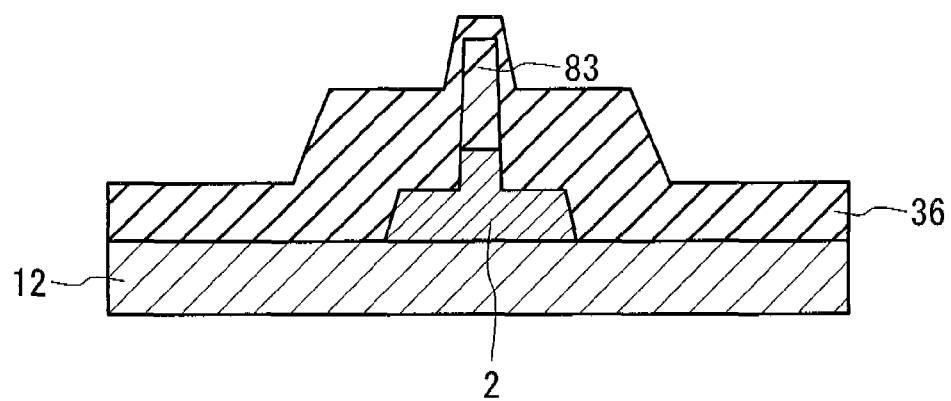
Figure 21E:
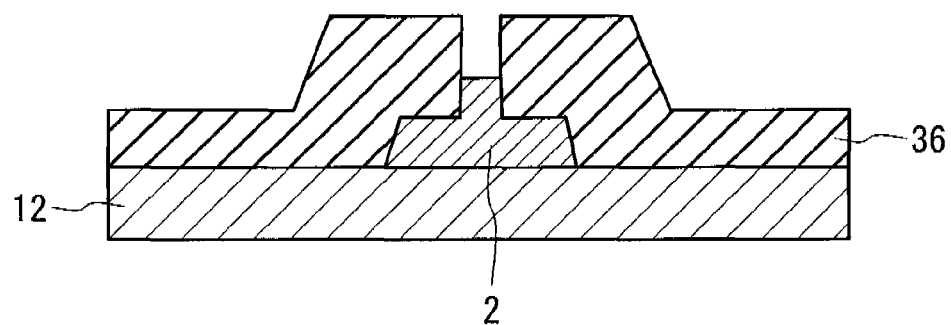

Then, after depositing an interlayer insulating layer 36 made of TEOS film over the entire area of the Si substrate and the lower electrode 2 (see FIG. 21D), the remaining resist 83 and the interlayer insulating layer 36 on the resist 83 are removed by lift-off to expose the upper surface of the mesa of the lower electrode 2 (see FIG. 21E).

Figure 21F:
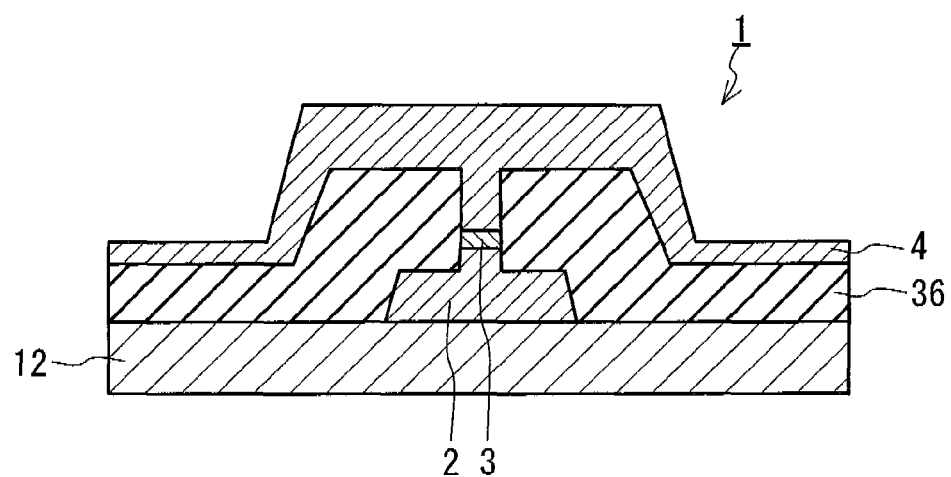

Then, after fabricating the electro-resistance layer 3 made of $Fe_2O_3$ by naturally oxidizing the mesa of the lower electrode 2 by leaving the whole under an oxygen atmosphere, an upper electrode 4 made of the $Fe_3O_4$ film with a thickness of 200 nm was formed similarly to the sample 2-2. Thus, an electro-resistance element (sample 6) was fabricated (see FIG. 21F). The mesa of the lower electrode 2 was oxidized by setting a temperature of the Si substrate in the range between 50° C. and 400° C. (typically at 280° C.) and leaving the whole under the oxygen atmosphere (for about 60 minutes). Here, the time length for oxidization process was adjusted to allow forming $Fe_2O_3$ (the layer 3) on the top of the mesa (see FIG. 21F) with the purpose of reducing the influence of the oxidization towards the lower electrode 2 upon oxidizing the mesa of the lower electrode 2. As an example, in the case of the mesa with the height of approximately 100 nm, an $Fe_2O_3$ layer with a thickness approximately in the range of 2 nm to 10 nm (typically 4 nm) was formed on the top of the mesa with the Si substrate at a temperature of 280° C. through approximately 30 minutes of the oxidizing process.

The change of the mesa of the lower electrode 2 into $Fe_2O_3$ by the oxidization was confirmed by crystallography by X-ray diffraction, infrared spectroscopy and Raman scattering spectroscopy.

The initial junction resistance of the sample 6 fabricated as above was evaluated in the same manner to the Example 1; it was approximately in the range of 10 Ω·μm² to 100 kΩ·μm².

The resistance change ratio of a ten fold change to a 100 fold change (typically a 50 fold change) was obtained by evaluating the ratio of the sample 6 in the same manner to the Example 1 separately from the evaluation of the junction resistance.

The results of Example 6 demonstrated that the electro-resistance layer made of $Fe_2O_3$ film could be formed by oxidizing the surface of the lower electrode made of the $Fe_3O_4$ film. It is found that the electro-resistance element of the present invention could be fabricated not only by a single raw material but also by the processes of forming an electro-resistance layer through oxidizing. Thus, the manufacturing processes of the present invention are considered to enable batch processing of a large number of wafers and a further reduction in processing costs is expected to be achieved.

Example 7

In Example 7, a preferable composition as an identical raw material to be employed for forming both a lower electrode 2 made of $Fe_3O_4$ and an electro-resistance layer 3 made of $Fe_2O_3$ was examined.

An $Fe_3O_4$ film with a thickness of 300 nm was formed on the Si substrate. The $Fe_3O_4$ film was formed by using an iron oxide having the composition represented by the formula $FeO_{x1}$ as a target and by magnetron sputtering under an argon atmosphere at a pressure of 0.1 Pa to 2 Pa (typically 0.6 Pa), setting a temperature of the Si substrate in the range between room temperature and 400° C. (mainly at 300° C.) and the applied electric power at RF 100 W.

It was found that $1/4 \leq x1 < 4/3$ is adequate for forming the $Fe_2O_4$ film from the perspectives of resistivity and crystallinity of the formed film through forming the $Fe_3O_4$ film by varying the x1 value in the range of 0 to 4/3. In particular, the resistivity of the formed $Fe_3O_4$ film was at the lowest when x1 was 3/4 (=0.75). The formation of the $Fe_3O_4$ film was confirmed by crystallography by X-ray diffraction, infrared spectroscopy and Raman scattering spectroscopy.

Next, an $Fe_2O_3$ film was formed on the formed $Fe_3O_4$ film. The $Fe_2O_3$ film was formed by using an iron oxide having the composition represented by the formula $FeO_{x2}$ as a target and by magnetron sputtering under an oxygen-argon mixture atmosphere (oxygen content was in the range of 0% to 50% by partial pressure) at a pressure of 0.1 Pa to 2 Pa (typically 0.6 Pa), setting a temperature of the Si substrate in the range between room temperature and 400° C. (mainly at 300° C.) and the applied electric power at RF 100 W.

It was found that $1/2 \leq x2 < 3/2$ is adequate for forming the $Fe_2O_3$ film from the perspectives of resistivity and crystallinity of the formed film through forming the $Fe_2O_3$ film by varying the x2 value in the range of 0 to 4/3.

It was found, consequently, that the identical raw material including iron and oxygen to be employed for forming both a lower electrode made of $Fe_3O_4$ and an electro-resistance layer made of $Fe_2O_3$ preferably had a composition represented by the formula $FeO_x (1/2 \leq x < 4/3)$.

As described above, the electro-resistance element according to the present invention is excellent in both affinity with semiconductor manufacturing processes and resistance change characteristics. Moreover, the electro-resistance element according to the present invention is capable of retaining information non-volatility as its electric resistance value and is micro-fabricated more easily than conventional charge storage type memory elements.

The electro-resistance element according to the present invention can be applied to various electronic devices, such as the next generation of high-density non-volatile memories. For example, it is expected to be applied to non-volatile memories, switching elements, sensors, and image display devices, which may be used for information communication terminals.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes that come within the meaning and range of equivalency of the claims are intended to be embraced therein.

What is claimed is:

1. An electro-resistance element, comprising:
   a substrate; and
   a multilayer structure disposed on the substrate,
   the multilayer structure including an upper electrode, a lower electrode, and an electro-resistance layer disposed between the upper and the lower electrodes,
   the electro-resistance element having two or more states in which electric resistance values between the upper and the lower electrodes are different, and
   being switchable from one of the two or more states into another by applying a predetermined voltage or current between the upper and the lower electrodes,
   wherein the electro-resistance layer includes $Fe_2O_3$, and an amount of $Fe_3O_4$ contained in the electro-resistance layer is 0% to 20% of an amount of $Fe_2O_3$ in percent by weight,
   the lower electrode is made of an iron oxide containing $Fe_3O_4$, and having a different composition from the electro-resistance layer, and
   the electro-resistance layer and the lower electrode make contact with each other.

2. The electro-resistance element according to claim 1, wherein the lower electrode consists essentially of $Fe_3O_4$.

3. The electro-resistance element according to claim 1, wherein the electro-resistance layer consists essentially of an iron oxide.

4. The electro-resistance element according to claim 1, wherein the lower electrode consists essentially of $Fe_2O_3$ and $Fe_3O_4$.

5. The electro-resistance element according to claim 1, wherein the lower electrode consists essentially of $Fe_2O_3$.

6. The electro-resistance element according to claim 1, wherein the predetermined voltage or current is in a pulse form.

7. An electro-resistance memory, comprising two or more of the electro-resistance element according to claim 1 as a memory element.

8. The electro-resistance memory according to claim 7, wherein the two or more of the electro-resistance elements are arranged in a matrix form.

9. A method of manufacturing the electro-resistance element according to claim 1, comprising:
   forming a lower electrode made of an iron oxide containing $Fe_3O_4$ on a substrate;
   forming an electro-resistance layer having a different composition from the iron oxide, and including $Fe_2O_3$ and $Fe_3O_4$ contained in an amount of 0% to 20% of $Fe_2O_3$ in percent by weight, on the lower electrode to make contact with each other; and
   forming an upper electrode sandwiching the electro-resistance layer with the lower electrode.

10. The method of manufacturing the electro-resistance element according to claim 9, wherein the iron oxide consists essentially of $Fe_3O_4$.

11. The method of manufacturing the electro-resistance element according to claim 9, wherein the iron oxide is Fe3O4, an electro-resistance layer made of an iron oxide is formed in the forming an electro-resistance layer step, an identical raw material containing iron and oxygen is used in the forming a lower electrode step and the forming an electro-resistance layer step, and a ratio $P_{oxy}/P_{inert}$ between partial pressure $P_{inert}$ of an inert gas and partial pressure $P_{oxy}$ of oxygen in an atmosphere in the forming an electro-resistance layer step is made larger than a ratio in an atmosphere in the forming a lower electrode step.

12. The method of manufacturing the electro-resistance element according to claim 11, wherein the raw material has a composition represented by a formula FeOx ($1/2 <= x < 4/3$).

13. The method of manufacturing the electro-resistance element according to claim 9,
   wherein the iron oxide is $Fe_3O_4$, and
   the electro-resistance layer made of an iron oxide is formed by oxidizing a surface of the lower electrode in the forming an electro-resistance layer step.

14. The method of manufacturing the electro-resistance element according to claim 9, wherein an electro-resistance layer consisting essentially of an iron oxide is formed in the forming an electro-resistance layer step.

15. The method of manufacturing the electro-resistance element according to claim 9, wherein an electro-resistance layer consisting essentially of $Fe_2O_3$ and $Fe_3O_4$ is formed in the forming an electro-resistance layer step.

16. The method of manufacturing the electro-resistance element according to claim 9, wherein an electro-resistance layer consisting essentially of $Fe_2O_3$ is formed in the forming an electro-resistance layer step.

* * * * *

UNITED STATES PATENT AND TRADEMARK OFFICE
CERTIFICATE OF CORRECTION

PATENT NO.       : 7,781,230 B2
APPLICATION NO.  : 11/683580
DATED            : August 24, 2010
INVENTOR(S)      : Odagawa et al.

It is certified that error appears in the above-identified patent and that said Letters Patent is hereby corrected as shown below:

Column 32, line 34 (Claim 11): "Fe304" should read --$Fe_3O_4$--
Column 32, line 45 (Claim 12): "FeOx(l/2<=x<4/3)" should read --$FeO_x(1/2 \leqq x < 4/3)$--

Signed and Sealed this
Eighteenth Day of January, 2011

David J. Kappos
*Director of the United States Patent and Trademark Office*